United States Patent
Yagi et al.

Patent Number: 6,143,190
Date of Patent: Nov. 7, 2000

[54] METHOD OF PRODUCING A THROUGH-HOLE, SILICON SUBSTRATE HAVING A THROUGH-HOLE, DEVICE USING SUCH A SUBSTRATE, METHOD OF PRODUCING AN INK-JET PRINT HEAD, AND INK-JET PRINT HEAD

[75] Inventors: Takayuki Yagi, Yokohama; Junichi Kobayashi, Ayase; Yasushi Kawasumi, Fujisawa; Genzo Momma, Hiratsuka; Kenji Makino, Yokohama; Kei Fujita, Sagamihara; Yasushi Matsuno, Atsugi; Yukihiro Hayakawa, Yokohama; Masahiro Takizawa, Kawasuki, all of Japan

[73] Assignee: Canon Kabushiki Kaisha, Tokyo, Japan

[21] Appl. No.: 08/967,732

[22] Filed: Nov. 12, 1997

[30] Foreign Application Priority Data

Nov. 11, 1996 [JP] Japan ................................. 8-298642
Nov. 11, 1996 [JP] Japan ................................. 8-298643
Nov. 11, 1997 [JP] Japan ................................. 9-308619

[51] Int. Cl.$^7$ .............................. B44C 1/22; H01L 21/306
[52] U.S. Cl. .................................. 216/27; 216/2; 216/56; 205/157; 205/171
[58] Field of Search .................................. 216/2, 27, 56; 205/157, 171, 656

[56] References Cited

U.S. PATENT DOCUMENTS

| | | | |
|---|---|---|---|
| 4,784,721 | 11/1988 | Holmen et al. | 156/647 |
| 5,169,806 | 12/1992 | Hawkins et al. | 437/233 |
| 5,308,442 | 5/1994 | Taub et al. | 156/644 |
| 5,658,471 | 8/1997 | Murthy et al. | 216/27 |

FOREIGN PATENT DOCUMENTS

| | | |
|---|---|---|
| 0609012 | 8/1994 | European Pat. Off. . |
| 0750992 | 1/1997 | European Pat. Off. . |
| 9-011479 | 1/1997 | Japan ................................. B41J 2/16 |

OTHER PUBLICATIONS

Bassous, "Fabrication of Novel Three–Dimensional Microstructures by the Anisotropic Etching of (100) and (110) Silicon," *IEEE Transaction on Electron Devices*, vol. ED–25, No. 10 (1978), pp. 1178–1185.

Binning et al., "Surface Studies by Scanning Tunneling Microscopy," *Physical Review Letters*, vol. 49, No. 1 (1982), pp. 57–60.

Imai, "A New Dielectric Isolation Method Using Porous Silicon," *Solid–State Electronics*, vol. 24 (1981), pp. 159–164.

Takai and Itoh, "Porous silicon layers and its oxide for the silicon–on–insulator structure," *J. Appl. Phys.*, vol. 60, No. 1 (1986), pp. 222–225.

*Primary Examiner*—Randy Gulakowski
*Assistant Examiner*—Shamim Ahmed
*Attorney, Agent, or Firm*—Fitzpatrick, Cella, Harper & Scinto

[57] ABSTRACT

The invention provides a method of producing a through-hole, a substrate used to produce a through-hole, a substrate having a through-hole, and a device using such a through-hole or a substrate having such a through-hole, which are characterized in that: a through-hole can be produced only by etching a silicon substrate from its back side; the opening length d can be precisely controlled to a desired value regardless of the variations in the silicon wafer thickness, and the orientation flat angle, and also regardless of the type of a silicon crystal orientation-dependent anisotropic etchant employed; high productivity, high production reproducibility, and ease of production can be achieved; a high-liberality can be achieved in the shape of the opening end even if temperature treatment is performed at a high temperature for a long time; and a high-precision through-hole can be produced regardless of the shape of a device formed on the surface of a substrate.

17 Claims, 26 Drawing Sheets

⟨111⟩ Si CRYSTAL FACE (111)

<111> Si CRYSTAL FACE

<111> Si CRYSTAL FACE

HANGING-OVER PART

<111> Si CRYSTAL FACE

⟨111⟩ Si CRYSTAL FACE

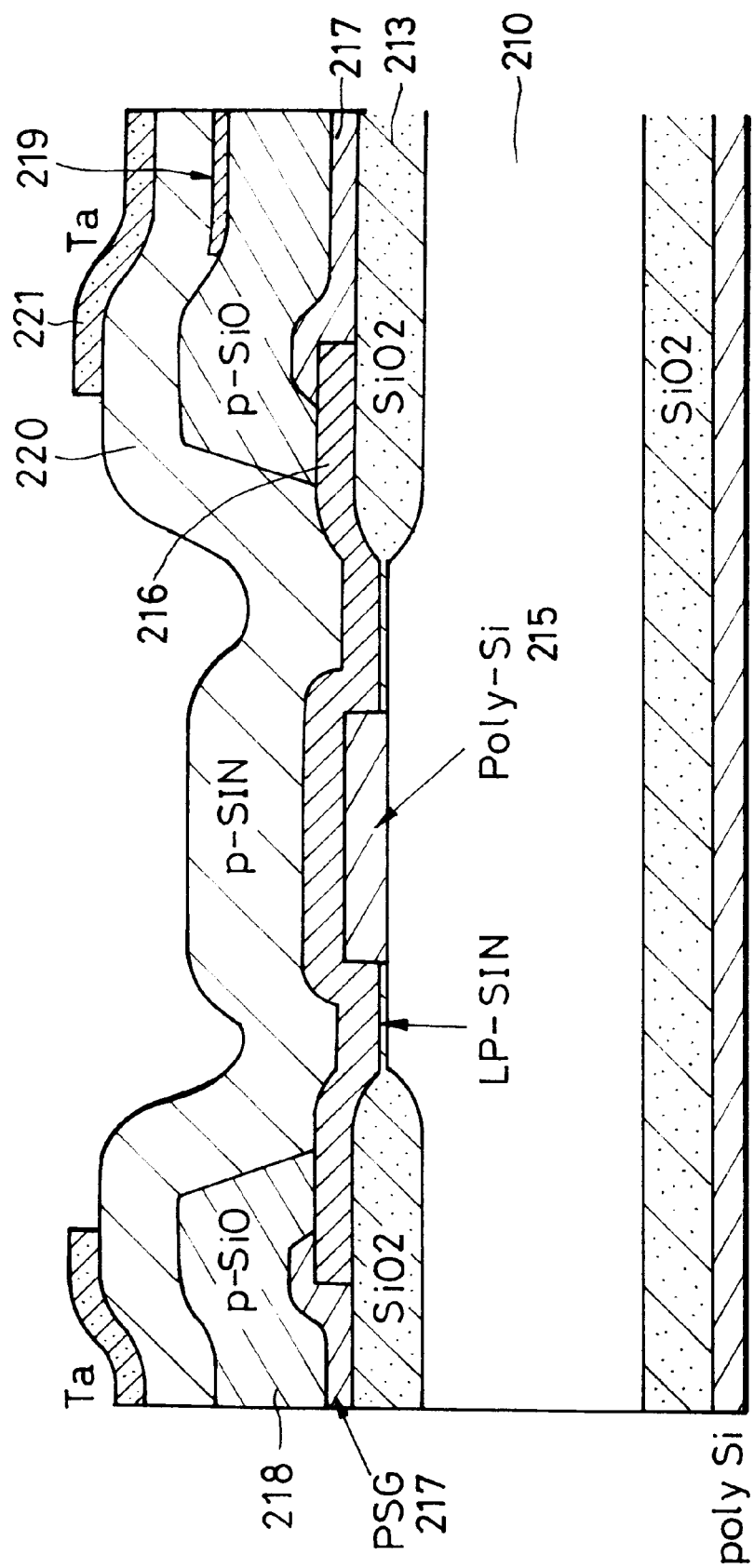

METHOD OF PRODUCING A THROUGH-HOLE, SILICON SUBSTRATE HAVING A THROUGH-HOLE, DEVICE USING SUCH A SUBSTRATE, METHOD OF PRODUCING AN INK-JET PRINT HEAD, AND INK-JET PRINT HEAD

BACKGROUND OF THE INVENTION

1. Field of the Invention

The present invention relates to a method of producing a through-hole in a silicon wafer, a substrate used to produce a through-hole, a device using such a substrate, a method of producing an ink-jet print head, and an ink-jet print head.

2. Description of the Related Art

In recent years, research and development has been carried out in the art of micromechanics with the objective of realizing a micromachine having an ultrasmall movable mechanism. In particular, the technique of forming a microstructure on a single-crystal silicon substrate using semiconductor integrated circuit technology (semiconductor photolithographic process) is promising in that a plurality of ultrasmall mechanical elements can be produced on the substrate with high reproducibility. This technique allows a plurality of such ultrasmall mechanical elements in an array form at a reduced cost. Furthermore, the reduction in the size of elements can result in a high response speed compared with the conventional mechanical structure. In the art of the micromechanics based on the semiconductor photolithographic process, bulk micro-machining is an essentially important technique to produce a high-precision through-hole used to realize a thin-film cantilever or nozzle. The bulk micro-machining technique is based on the technique of etching a silicon substrate by means of a crystal orientation-dependent anisotropic etching process in which etching for (111) crystal surfaces occurs at a different rate from that for other crystal surfaces. The technique of producing a through-hole by etching a silicon substrate from its back side by means of a crystal orientation-dependent anisotropic etching process is useful to produce various devices such as a cantilever and a micro valve on the surface of the substrate, and therefore intensive research and development is being carried out with the objective of realizing various devices using this technique.

One known device using a cantilever is a cantilever probe used in a scanning probe microscope (hereinafter also referred to as an SPM). The advent of scanning tunnel microscope s capable of directly observing electron structures of atoms on the surface of a conductor (G. Binnig et al., Phys. Rev. Lett., 49, 57(1983)) has made it possible to obtain a high-resolution microscopic spatial image of an object regardless of whether the object is in a single crystal form or an amorphous form. Thus, the SPM is now widely used to evaluate the microstructure of specimens. To improve the performance and function of the SPM, thin-film cantilevers having various capabilities realized in an integral fashion have been proposed. For example, in the atomic force microscope capable of measuring the microscopic structure of the surface of a specimen by means of detecting repulsive and attractive force at the surface of a substance, it has been proposed to use a piezoresistance cantilever having a piezoresistance integrated on a cantilever instead of a conventional cantilever using an optical lever to detect deflection (M. Tortonese et al., "Atomic Force Microscopy using a Piezoresistive Cantilever", The 6th International Conference on Solid-State Sensors and Actuators, Transducers '91, 1991, pp. 448–451). Using such a piezoresistance cantilever, it is possible to detect a microscopic surface structure even in vacuum or at a low temperature without needing external detection devices such as a laser, an optical component, and a photodetector.

A method of producing such a piezoresistance cantilever by means of silicon crystal orientation-dependent anisotropic etching is described below with reference to FIG. 20.

First, an SOI wafer 500 serving as a substrate is prepared by forming a silicon dioxide layer 502 and an n-type silicon layer 503 on a p-type silicon substrate 501 (refer to FIG. 20A). A silicon dioxide layer 504 is then formed on the principal surface and also the back surface of the SOI wafer. The silicon dioxide film 504 on the principal surface is removed, and boron (B) is implanted and diffused into the n-type silicon layer 503 thereby forming a resistor pattern 505 in the shape of a cantilever in the n-type silicon layer. Furthermore, a thin silicon dioxide film 507 serving as a passivation layer is formed on the cantilever and a contact hole is then formed therein. Subsequently, an aluminum metal electrode 508 is formed thereon. An opening 506 for use as an etching window is formed in the silicon dioxide film 504 on the back surface of the SOI wafer (FIG. 20B). The p-type silicon substrate is then etched via the opening 506 by EDP (ethylenediamine/pyrocatechol) serving as a crystal orientation-dependent anisotropic etchant for silicon thereby forming a hole surrounded by (111) surfaces of the silicon substrate and the membrane of the silicon dioxide layer 502. The silicon dioxide layer 502 is partially removed using hydrofluoric acid thereby forming a through-hole thus forming a piezoresistance cantilever (FIG. 20C).

In the above technique of producing a through-hole by etching a silicon substrate from its back surface using a crystal orientation-dependent anisotropic etchant, the opening length d at the principal surface of the substrate is, as shown in FIG. 21, determined by the opening length D at the back surface of the substrate, the substrate thickness t, and the crystal orientation-dependent anisotropic etchant employed. When a (100) silicon substrate is used, the opening length d is approximately given by $$d \sim (D - 2t/\tan(54.7°) + 2Rt/\sin(54.7°)) \tag{1}$$

where R is the ratio of the etching rate for the (111) surface to that for the (100) surface. Thus it is possible to obtain cantilever having a desired length simply by controlling the opening length D to a proper value depending on the material of the cantilever and the thickness of the substrate. Therefore, it is possible to produce a cantilever having a desired resonance frequency and a spring constant. In a similar manner, it is also possible to produce a nozzle having a desired orifice diameter. As described above, various devices having a cantilever or a nozzle on the surface of a substrate can be produced by etching a silicon substrate from its back side using a crystal orientation-dependent anisotropic etchant thereby forming a through-hole. In both examples described above, the length of the cantilever and the diameter of the orifice are determined by the opening length.

However, silicon wafers vary in thickness and orientation flat indicating the crystal axis, from wafer to wafer and from lot to lot, due to variations in production conditions. For example, the wafer-to-wafer and lot-to-lot variations of 4 inch diameter silicon wafers are 500 $\mu$m to 525 $\mu$m in thickness (thickness variation $\Delta t=25$ $\mu$m) and $\pm 0.4°$ in crystal axis. Thus, when a (100) wafer with a diameter of 4 inches is used, a variation $\Delta d$ of about 35 $\mu$m occurs in the opening length of the through-hole measured at the surface of the substrate due to the thickness variation Δt, from wafer to wafer or from lot to lot.

Because the back side opening is patterned with respect to the orientation flat, the variation in the orientation flat angle results in a variation in the angle of the back side opening. Therefore, in the case where there is a variation in the orientation flat angle of the order described above, if a through-hole having an opening length of 1000 μm measured at the surface is produced, a variation of about 12 μm can occur in the opening length from wafer to wafer or from lot to lot.

As described above, when the through-hole is formed by etching the silicon substrate from its back surface, a variation Δd occurs in the opening length due to the variations in production parameters such as substrate thickness and orientation flat angle. As a result, when a cantilever is produced, the opening length variation Δd causes a variation of order of a few ten μm in the length of the cantilever. Therefore, the mechanical characteristics such as resonance frequency and spring constant of the produced cantilever vary from substrate to substrate. This makes it difficult to produce a cantilever without encountering wafer-to-wafer variations in the mechanical characteristics.

KOH and EDP used as a crystal orientation-dependent anisotropic etchant are highly toxic and difficult to deal with. To avoid the problem of toxicity, TMAH (tetramethyl ammoniumhydoroxide) has come to be used recently instead of KOH or EDP. TMAH is low in toxicity and contains no metal ions, and thus it is an excellent etchant having good compatibility with LSI processes. TMAH has a property that the ratio R of the etching rate for a (100) surface of silicon to that for a (111) surface varies with the concentration of TMAH (U. Schnakenberg et al., "TMAHW Etchants for Silicon Micromachining", The 6th International Conference on Solid-State Sensors and Actuators, Transducers 91, 1991, pp. 815–818). For example, when the concentration of TMAH is 22 wt %, the etching rate ratio R will be 0.03, while the etching rate ratio R will be 0.05 when the concentration of TMAH is 10 wt %. If such a variation in the etching rate ratio R is taken into account in equation (1), it can be seen that an opening length variation Δd of 27 μm occurs owing to the variation in the TMAH concentration when the substrate thickness is maintained at 525 μm. This means that when a through-hole is produced using TMAH, the variation in the opening length d is affected not only by the variations in the substrate thickness and the orientation flat angle but also by the variation in the concentration of the etchant, and thus the variation in the opening length becomes greater.

One known technique of producing a nozzle having a desired opening length on a silicon substrate is to form a high-concentration p-type diffusion layer on the silicon substrate (E. Bassous, "Fabrication of Novel Three-Dimensional Microstructures by the Anisotropic Etching of (100) and (110) Silicon", IEEE Trans. on Electron Devices, Vol. ED-25, No. 10, 1978, p. 1178-). This technique utilizes the property that a p-type diffusion layer with an impurity concentration higher than $7 \times 10^{19}$ cm$^{-3}$ is not etched by a crystal orientation-dependent anisotropic etchant. In this technique, an orifice is formed as follows. First, a silicon dioxide film is formed on a silicon substrate. The silicon dioxide film is then patterned into the shape of an orifice. Boron (B) is diffused into the substrate to a high impurity level thereby forming a p-type diffusion layer. Another silicon dioxide layer is then formed thereon, and an opening is formed in the silicon dioxide film on the back surface of the substrate. Subsequently, the silicon substrate is etched by a crystal orientation-dependent anisotropic etchant thereby forming a nozzle surrounded by (111) surfaces of the silicon substrate and a membrane of p-type diffusion layer having an orifice. Although this technique is capable of producing a high-precision orifice, this technique has a problem that the thickness of the membrane is as small as 3 μm. To increase the thickness of the membrane, high-concentration ion implantation is required, and thus a long time is required to perform ion implantation. Furthermore, a long diffusion time is required to achieve a thicker diffusion layer. For example, to obtain a diffusion layer with a thickness of 15 to 20 μm, impurity ions should be implanted to a level of as high as $1 \times 10^{16}$ or higher atoms/cm$^2$. Furthermore, it is also required to perform diffusion at 1175° C. for a time as long as 15 to 20 hours. This results in a reduction in productivity. If a silicon substrate is subjected to high-temperature treatment for a long time, crystal defects can occur in the bulk of silicon crystal or the defect density increases. The crystal defects can cause anomalous etching to the (111) surfaces during the crystal orientation-dependent anisotropic etching process, thus causing deformation of the shape of the opening end from the ideally linear shape. As a result, a variation occurs in the opening length d measured at the surface of the substrate.

When an electronic circuit is integrated on a silicon substrate, it is required to perform a heat treatment at a temperature for a time similar to those described above so as to form an nMOS well and an insulating diffusion layer. The density of crystal defects generated during heat treatment varies across a wafer and varies from lot to lot. Such a variation in the defect density can cause a variation in the opening length d from opening to opening. When a micromechanical device and an electronic device are integrated together, crystal defects can cause deformation of the shape of the opening end at the surface of the substrate from the ideally linear shape. Another problem of this technique is that it is impossible to form a diffusion layer below a previously-formed device such as a piezoresistance cantilever on an SOI substrate.

In view of the above-described problems in the conventional techniques, the object of the present invention is to provide a method of producing a through-hole, a substrate used to produce a through-hole, a substrate having a through-hole, and a device using such a through-hole or a substrate having such a through-hole, which are characterized in that:

(1) A through-hole can be produced only by etching a silicon substrate from its back side;

(2) The opening length d can be precisely controlled to a desired value regardless of the variation in the silicon wafer thickness from wafer to wafer or from lot to lot;

(3) The opening length d can be precisely controlled to a desired value regardless of the variation in the orientation flat angle from wafer to wafer or from lot to lot;

(4) The opening length d can be precisely controlled to a desired value regardless of the type of a silicon crystal orientation-dependent anisotropic etchant employed;

(5) High productivity, high production reproducibility, and ease of production can be achieved;

(6) A high-liberality can be achieved in the shape of the opening end even if temperature treatment is performed at a high temperature for a long time; and (7) A high-precision through-hole can be produced regardless of the shape of a device formed on the surface of a substrate.

SUMMARY OF THE INVENTION

According to an aspect of the invention, to achieve the above object, there is provided a method of producing a through-hole in a silicon substrate, the method comprising the steps of: (a) forming a dummy layer on the principal surface of the substrate at a location where the through-hole will be formed, the dummy layer being capable of being selectively etched without etching the material of the substrate; (b) forming a passivation layer having resistance to an etching process on the substrate in such a manner that the dummy layer is covered with the passivation layer; (c) forming an etching mask layer on the back surface of the substrate, the etching mask layer having an opening corresponding to the dummy layer; (d) etching the substrate by means of a crystal orientation-dependent anisotropic etching process until the dummy layer is exposed via the opening; (e) removing the dummy layer by etching the dummy layer from the part which has been exposed in the step of etching the substrate; and (f) partially removing the passivation layer so as to form a through-hole.

According to another aspect of the invention, there is provided a method of producing a through-hole in a silicon substrate, the method comprising the steps of: (a) forming an epitaxial growth preventing layer for preventing epitaxial growth on a part of the substrate, and then forming an epitaxial layer on the substrate thereby forming a dummy layer capable of being selectively etched without etching the material of the substrate, the dummy layer being formed on the epitaxial growth preventing layer at a location where the through-hole will be formed; (b) forming a passivation layer having resistance to an etching process on the substrate such that the dummy layer is covered with the passivation layer; (c) forming an etching mask layer on the back surface of the substrate, the etching mask layer having an opening corresponding to the dummy layer; (d) etching the substrate by means of a crystal orientation-dependent anisotropic etching process until the epitaxial growth preventing layer is exposed via the opening; (e) removing the part of the epitaxial growth preventing layer exposed in the step of etching the substrate; (f) removing the dummy layer by etching it via the removed part of the epitaxial growth preventing layer; and (g) partially removing the passivation layer so as to form a through-hole.

In the technique according to the present invention, the opening size of a through-hole produced is determined by a dummy layer formed on the surface of a substrate. Therefore, a high-precision through-hole can be produced by etching a substrate from its back side without producing variation in the opening size and without producing a reduction in linearity in the shape of the opening end regardless of the variations in the substrate thickness, the orientation flat angle, and the concentration of an etchant. If the dummy layer is formed in an embedded fashion in the substrate, a planar structure can be achieved on the surface of the substrate. Thus, the methods of producing a through-hole according to the present invention offer high productivity, ease in production, and high production reproducibility.

DESCRIPTION OF THE PREFERRED EMBODIMENTS

Figure 1A:
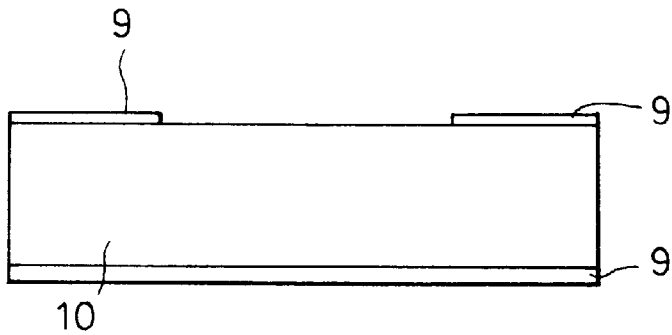
FIG. 1 is a cross-sectional view illustrating the processing steps of producing a through-hole according to a first embodiment of the invention.

The method of forming a through-hole according to the present invention will be described in further detail below with reference to preferred embodiments.

In the present invention, a dummy layer is first formed on the surface of a silicon substrate before performing anisotropic etching. A passivation layer is formed on the principal surface of the substrate on which the dummy layer is formed, and the substrate is etched from its back surface. In the above etching process, the back surface of the substrate is covered with a mask layer having resistance to an etchant and having an opening so that the silicon substrate is etched through the opening thereby forming a hole in the silicon substrate. The etching of the silicon substrate is performed using a crystal orientation-dependent anisotropic etchant such as KOH, EDP, TMAH, or hydrazine whose etching rate varies depending on the crystal surface. As the etching process proceeds, the hole finally reaches the dummy layer. The dummy layer is then removed. To rapidly remove the dummy layer located between the silicon substrate and the passivation layer, the dummy layer is etched using an isotropic etchant. It is required that the above isotropic etchant should be such a type of etchant which does not attack the silicon substrate after the dummy layer has been etched so as to prevent the silicon substrate from being isotropically etched, which would make it impossible to control the opening length. After the above process, the passivation layer formed on the silicon substrate remains in the form of a membrane. The part of the passivation layer remaining at the end of the hole is then etched so as to form a through-hole.

A preferable material used to form the dummy layer is polycrystalline silicon. The polycrystalline silicon film is excellent in compatibility with the LSI process and also excellent in process reproducibility, and thus it is suitable for use as the dummy layer. If the polycrystalline silicon film is employed as the dummy layer, the isotropic etchant used to etch the dummy layer may also be used as a crystal orientation-dependent etchant for etching the silicon substrate. This means that after etching the silicon substrate from its back surface via the opening, the dummy layer can be removed by the same etchant. This allows the process to be simplified. The thickness of the dummy layer may be set to any value within the range which can be realized in the form of a thin film. If the dummy layer is thin, it is difficult for the isotropic etchant to penetrate between the substrate and the passivation layer. However, it is possible to properly control the opening length using the dummy layer by alternately or simultaneously performing the etching of the dummy layer and the etching of the substrate. For example, when polycrystalline silicon with a thickness of a few hundred to a few thousand Å is employed as the dummy layer, the isotropic etching of the dummy layer and the anisotropic etching of the substrate can be performed at the same time.

The dummy layer may be formed on the silicon substrate by patterning the polycrystalline silicon layer on the silicon substrate into a desired shape using a photolithographic process and an etching process. Alternatively, the dummy layer may be formed by partially altering the crystallinity or material property of the silicon substrate into a porous property thereby forming an embedded dummy layer in the silicon substrate. A specific method of forming such an embedded dummy layer will be described below. A porous silicon may be formed by partially anodizing the silicon substrate as follows. A platinum electrode and a silicon substrate coated with a film such as a silicon nitride film or a resist having resistance to hydrofluoric acid are immersed in a vessel containing 5 to 50 vol % hydrofluoric acid. The film having resistance to hydrofluoric acid is partially removed in advance such that a desired part of the silicon substrate to be converted into porous silicon is exposed. The platinum electrode is connected to the positive electrode of a power supply and the silicon substrate is connected to the negative electrode thereof, and a current of 5 to a few hundred $mA/cm^2$ is passed so that the exposed portion of the silicon substrate is converted to porous silicon at a rate of 0.5 to 10 $\mu m/min$. Alternatively, the silicon substrate may be placed in a vessel having two sections in such a manner that the both surfaces of the silicon substrate are in contact with hydrofluoric acid in different sections isolated from each other, and a current may be passed between electrodes placed in the respective sections. In this case, there is no need to attach an electrode directly to the silicon substrate. In this way, the portion of the silicon substrate exposed via the window of the film having resistance to hydrofluoric acid is converted to porous silicon. Depending on reacting conditions, materials which can be employed to form the film having resistance to hydrofluoric acid include Cr, Cu, Ag, Pd, Au, Pt, silicon nitride, and amorphous silicon. An impurity diffusion layer having an opposite polarity to that of the substrate may be formed on the substrate so that the impurity diffusion layer serves as a corrosion resistant layer during the anodization process in which a voltage is applied to the substrate (K, Imai, Solid-State Electronics, Vol. 24, pp. 159–164).

The porous layer formed in the above-described manner can be selectively etched quickly by a proper etchant such as aqueous sodium hydroxide or hydrofluoric acid having a different etching rate for porous silicon from that for the silicon substrate such that only the porous layer is removed without etching the other part of the silicon substrate. More specifically, the hydrofluoric acid-based etchants which can be used to etch the porous silicon include hydrofluoric acid+hydrogen peroxide ($H_2O_2$), hydrofluoric acid+$H_2O_2$+alcohol, buffered hydrofluoric acid (mixture of HF and $NH_3F$), buffered hydrofluoric acid+$H_2O_2$, and buffered hydrofluoric acid+$H_2O_2$+alcohol. Alternatively, a crystal orientation-dependent etchant used to etch silicon may also be used as an etchant for isotropically etching porous silicon. If such an etchant is employed, it is possible to isotropically etch the embedded dummy layer with the same etchant after etching the silicon substrate.

As for the embedded layer, in addition to the material described above, a silicon dioxide layer obtained by thermally oxidizing porous silicon formed on the silicon substrate may also be employed. The oxidation rate for porous silicon is 100 or more times greater than that for single-crystal silicon (H, Takai and T. Itoh, "Porous silicon layers and its oxide for the silicon-on-insulator structure", J. Appl. Phys., Vol. 60 pp. 222–225, 1986), and therefore it is possible to form a dummy layer of silicon dioxide by oxidizing porous silicon formed in an embedded fashion in a silicon substrate. Also in this case, an opening with a desired size can be formed on the surface of the substrate by anisotropically etching the silicon substrate via a mask layer until the etched hole reaches the embedded dummy layer of silicon dioxide and then etching the embedded dummy layer using a hydrofluoric acid-based etchant.

Alternatively, polycrystalline silicon having crystallinity different from that of the silicon substrate and embedded in a part of the silicon substrate may be employed as the dummy layer. The polycrystalline silicon can be formed as follows. First, an epitaxial growth preventing layer for preventing an epitaxial layer from growing is formed on a part of a silicon substrate. If silicon epitaxial growth is then performed on the substrate, a polycrystalline silicon layer serving as a dummy layer is formed on the epitaxial growth preventing layer while a silicon epitaxial layer is formed on the other part of the substrate. Polycrystalline silicon can be etched in an isotropic fashion using an etchant which serves as a crystal orientation-dependent anisotropic etchant to silicon. As for the epitaxial growth preventing layer, any polycrystalline or amorphous layer may be employed as long as it has the ability of preventing the growth of an epitaxial layer and has resistance to the high growth temperature. More specifically, materials which have good compatibility with silicon semiconductor processes and which are suitable for the above purpose include silicon dioxide, silicon nitride, and polycrystalline silicon. In particular, silicon dioxide and silicon nitride films have high etching resistance to anisotropic etchants. Therefore, when the substrate is etched via the opening, the silicon dioxide or silicon nitride film also servers as an etching stopper layer at which the etching is stopped. Furthermore, the silicon dioxide or silicon nitride film also serves to prevent silicon under the dummy layer from being etched when the embedded dummy layer is isotropically etched by the etchant having anisotropic property to silicon.

When the silicon substrate employed contains crystal defects generated during a high temperature process, the (111) surfaces are etched in an anomalous fashion during the anisotropic etching process due to the crystal defects. However, if the embedded dummy layer is employed, it is possible to obtain a through-hole having a precisely controlled opening length d with substantially no variation in the opening length.

The sizes of the opening and the dummy layer are selected so that when the substrate is etched from its back surface via the opening, the opening size of the resultant hole measured at the surface of the substrate is smaller than the size of the dummy layer. This setting of the sizes makes it possible to precisely control the opening length by means of the dummy layer. When a (100) silicon substrate is employed, the length d1 of the dummy layer (refer to FIG. 2) should be in a particular range as described below relative to the value d in equation (1):

$$d1 > d \qquad (2)$$

In the case where the crystal orientation of the silicon substrate is offset from the (100) by an angle of $\alpha$ (°), the length d1 of the porous silicon layer should be in the range described below.

$$d1 > (D - t/\tan(54.7° + \alpha) - t/\tan(54.7° - \alpha) + Rt/\sin(54.7° + \alpha) + Rt/\sin(54.7° - \alpha)) \qquad (3)$$

In equation (3), the angle $\alpha$ in trigonometric functions is uniquely determined from the offset angle of the orientation of the substrate surface relative to (111). The present invention is also effective when a silicon substrate having another crystal orientation is employed.

In the through-hole produced in accordance with the present invention, the diameter d' of the opening at the principal surface of the substrate (on which a functional device such as a cantilever or an ink nozzle is formed) has the following relationship with other parameters $$d' > (D - 2t/\tan(54.7°)) \qquad (4)$$

where D' is the opening diameter, measured at the back surface, of the through-hole formed by the anisotropic etching, and t is the thickness of the silicon substrate. As can be seen from inequality (4), it is possible to obtain a desired opening diameter at the principal surface of the substrate using a back-side opening which is not significantly large. This allows a reduction in the size of the substrate and an improvement in the mechanical strength of the substrate.

In the present invention, in the case where a passivation layer is formed on a dummy layer, a membrane of passivation layer is formed when the dummy layer is etched. The passivation film is made of a material having resistance to the crystal orientation-dependent anisotropic etchant and also to the isotropic etchant used to etch the dummy layer. This allows various types of devices to be formed on the surface of the substrate. The passivation layer may be formed using a known technique such as vacuum evaporation, sputtering, chemical vapor deposition, plating, or thin film coating technique.

A nozzle for supplying gas or liquid can be realized using a substrate with a through-hole formed in accordance with the method of the present invention. If a heating resistor, a flow path, and a nozzle are further formed on the surface of the substrate, then an ink-jet print head with a through-hole serving as an ink emission opening can be realized.

Furthermore, in the present invention, a cantilever for use in a scanning probe microscope can be produced by forming a thin-film cantilever on a dummy layer on the surface of a substrate via a passivation layer and then forming a through-hole by etching the substrate from its back side.

SPECIFIC EMBODIMENTS

The present invention will be described in further detail below with reference to specific embodiments associated with a through-hole, a method of producing a through-hole, and a device produced using such a through-hole, in conjunction with FIGS. 1 to 22.

First Embodiment

Figure 1B:
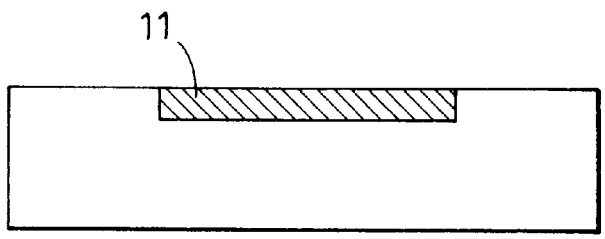
Figure 1C:
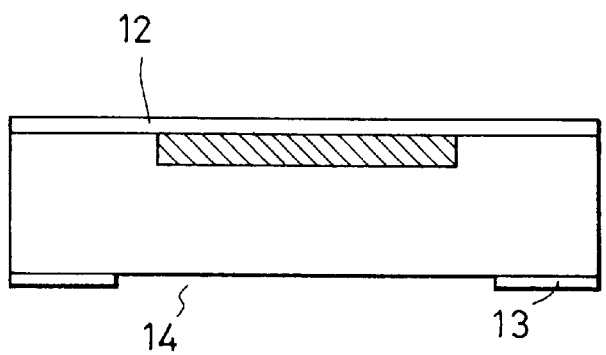
Figure 2:
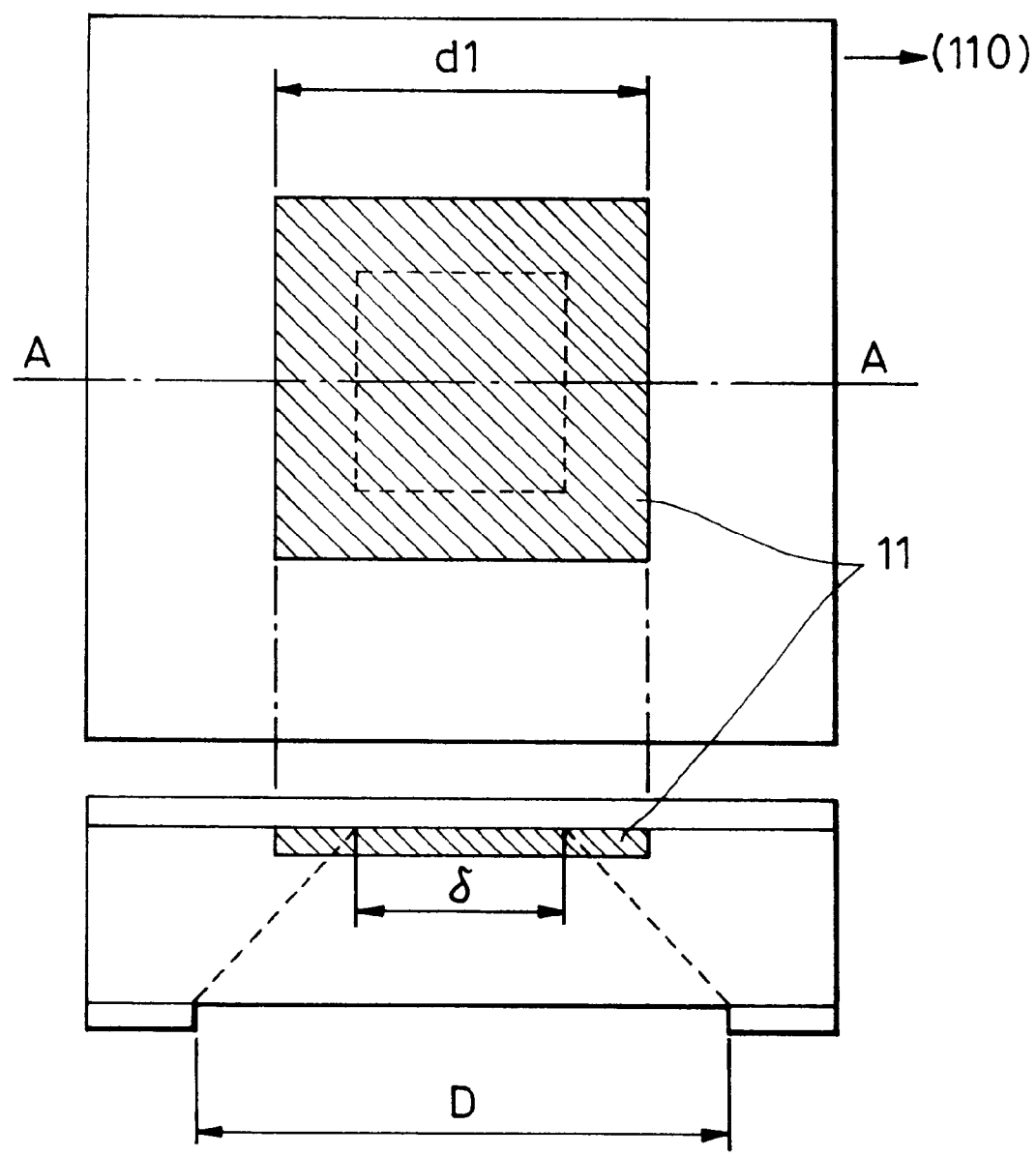
FIG. 2 is a cross-sectional view illustrating the pattern and the layout of an embedded dummy layer according to the first embodiment of the invention.
Figure 3A:
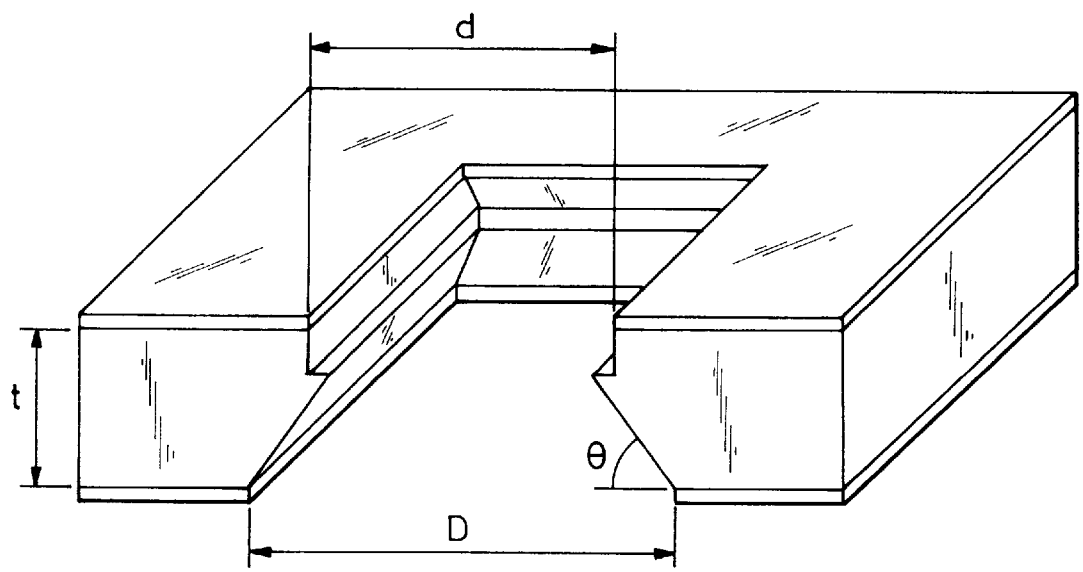
FIG. 3 is a perspective view illustrating a through-hole according to the first embodiment of the invention.
Figure 3B:
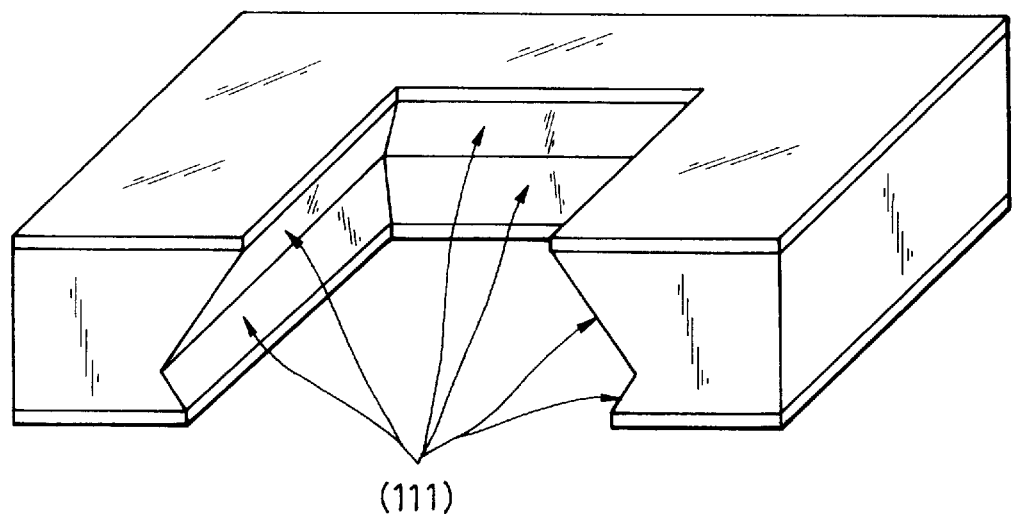

FIG. 1 is a cross-section view illustrating the processing steps of producing a through-hole according to the present invention. FIG. 2 is a top view and cross-sectional view of a substrate on which there is provided a porous silicon layer serving as an embedded dummy layer 11 by which the through-hole is produced. FIG. 3A is a perspective view illustrating an example of the characteristic structure of a through-hole seen from its cross section. As shown in FIGS. 3A and 3B, the through-hole according to the present invention is characterized in that it has a bent shape in cross section unlike the conventional through-hole shown in FIG. 20 having a trapezoidal shape in cross section. With the method according to the invention, it is possible to control the cross-sectional shape of the through-hole as shown in FIGS. 3A and 3B by properly changing the etching time. This makes it possible to control the fluid conductance of a nozzle surrounded by the (111) crystal surfaces to a desired value.

The method of producing a through-hole according to the present invention will be described below with reference to FIG. 1. Using an LPCVD (low pressure chemical vapor deposition) technique, a 100 nm thick silicon nitride film 9 serving as a hydrofluoric acid-resistant film was formed on a p-type (100) silicon substrate 10 having a thickness of 525 $\mu$m and a resistivity of 0.02 $\Omega$·cm. The silicon nitride film 9 was subjected to reactive ion etching using $CF_4$ gas through a patterned photoresist mask formed by a photolithographic process. The photoresist was then removed so that the silicon was exposed as shown in FIG. 1A. A layer 11 used to form a porous silicon layer was formed as follows. First, the silicon substrate 10 on which the silicon nitride film 9 was formed was anodized in a solution of hydrofluoric acid (49%): water: ethanol=1:1:1. The anodization was performed by passing a current of 30 mA/$cm^2$ between the silicon substrate and the opposing electrode. In the above anodization process, porous silicon was formed at a rate of 2 μm/min until a porous silicon layer with a thickness of 10 μm serving as the embedded dummy layer was formed. Subsequently, the silicon nitride film 9 was removed (FIG. 1B). In this embodiment, the pattern of the embedded dummy layer was selected such that it had the shape of a square each side of which has a length of d1.

A passivation film 12 and a silicon nitride film both having a thickness of 500 μm were formed by means of LPCVD on the principal surface and the back surface, respectively, of the substrate, wherein the silicon nitride film was to serve in the subsequent process step as a mask layer 13 through which the silicon substrate 10 would be etched by a crystal orientation-dependent etchant. The mask layer 13 on the back surface of the substrate was partially removed by means of reactive ion etching using $CF_4$ gas through a photoresist formed by a photolithographic process thereby forming an opening 14 in the mask layer 13 as shown in FIG. 1C so that the silicon surface was exposed through the opening 14 of the mask layer 13. The photoresist was then removed. FIG. 2 illustrates the pattern of the opening 14 seen from the upper side of the substrate. In this embodiment, as shown in FIG. 2, the opening has a square shape each side of which has a length of D. The opening length D was determined so that the length δ of each side of a square represented by a broken line in the top view of FIG. 2, which would be obtained at the principal surface of the silicon substrate if the silicon substrate were etched thoroughly through it by a crystal orientation-dependent anisotropic etchant, was smaller than the length d1 of the porous silicon layer serving as the dummy layer.

Figure 1D:
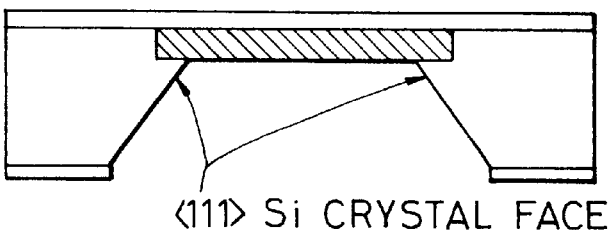
Figure 1E:
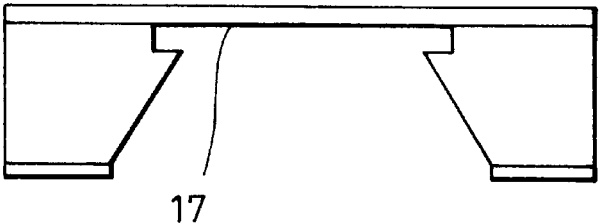
Figure 1F:
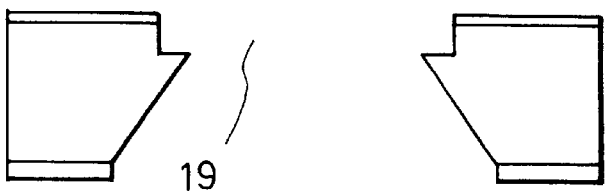

After removing the photoresist, the silicon substrate was subjected to crystal orientation-dependent anisotropic etching using an aqueous solution of 27% potassium hydroxide (KOH) at a solution temperature of 90° C. so as to form a pyramid-shaped hole surrounded by (111) crystal surfaces (FIG. 1D). The etching was continued further until the porous silicon serving as the embedded dummy layer 11 was isotropically etched and removed by the aqueous solution of KOH and a membrane of passivation film 17 was formed (FIG. 1E). Subsequently, the membrane of passivation film was removed by performing reactive ion etching from the back side of the substrate thereby forming a through-hole 19 (FIG. 1F).

To investigate the influence of the thickness of the substrate, a through-hole was also formed using a (100) silicon substrate with a thickness of 500 μm by forming a similar porous silicon layer and a similar opening. The result has revealed that the opening has a similar size measured at the principal surface of the silicon substrate regardless of the thickness of the substrate. In this method of producing a through-hole according to the invention, as described above, the length d of the opening (FIG. 3A, θ=54.7°) is determined by the length d1 of the embedded dummy layer, and the variation in the substrate thickness does not cause a variation in the length of the opening at the primary surface of the substrate.

In FIG. 1E, in the case where the crystal orientation-dependent anisotropic etching was continued further without being stopped, the outward-projecting portion of the substrate was etched after the embedded dummy layer was removed, and the resultant through-hole had a shape surrounded by (111) crystal surfaces shown in FIG. 3B. Also in the through-hole having such a cross-sectional shape, the opening length d was not affected by the variation in the substrate thickness.

Furthermore, in this method of producing a through-hole according to the invention, the variation in the opening length D does not cause a variation in the opening length d as long as the variation in the opening length D is within a certain range. The allowable range of D is such a range which satisfies the following relationship.

$$(d1-\delta)>0 \quad (5)$$

Second Embodiment

Figure 4A:
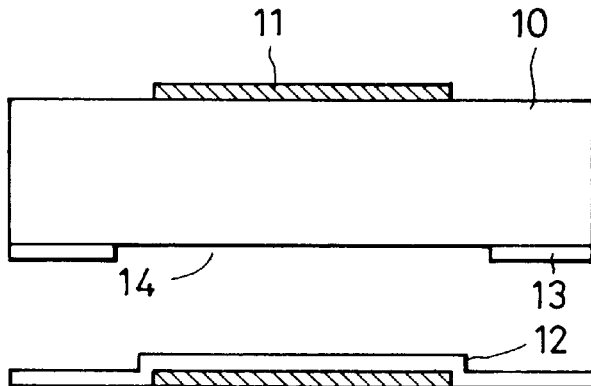
FIG. 4 is a cross-sectional view illustrating the processing steps of producing a through-hole according to a second embodiment of the invention.
Figure 4B:
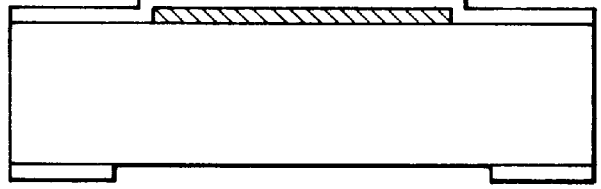
Figure 5:
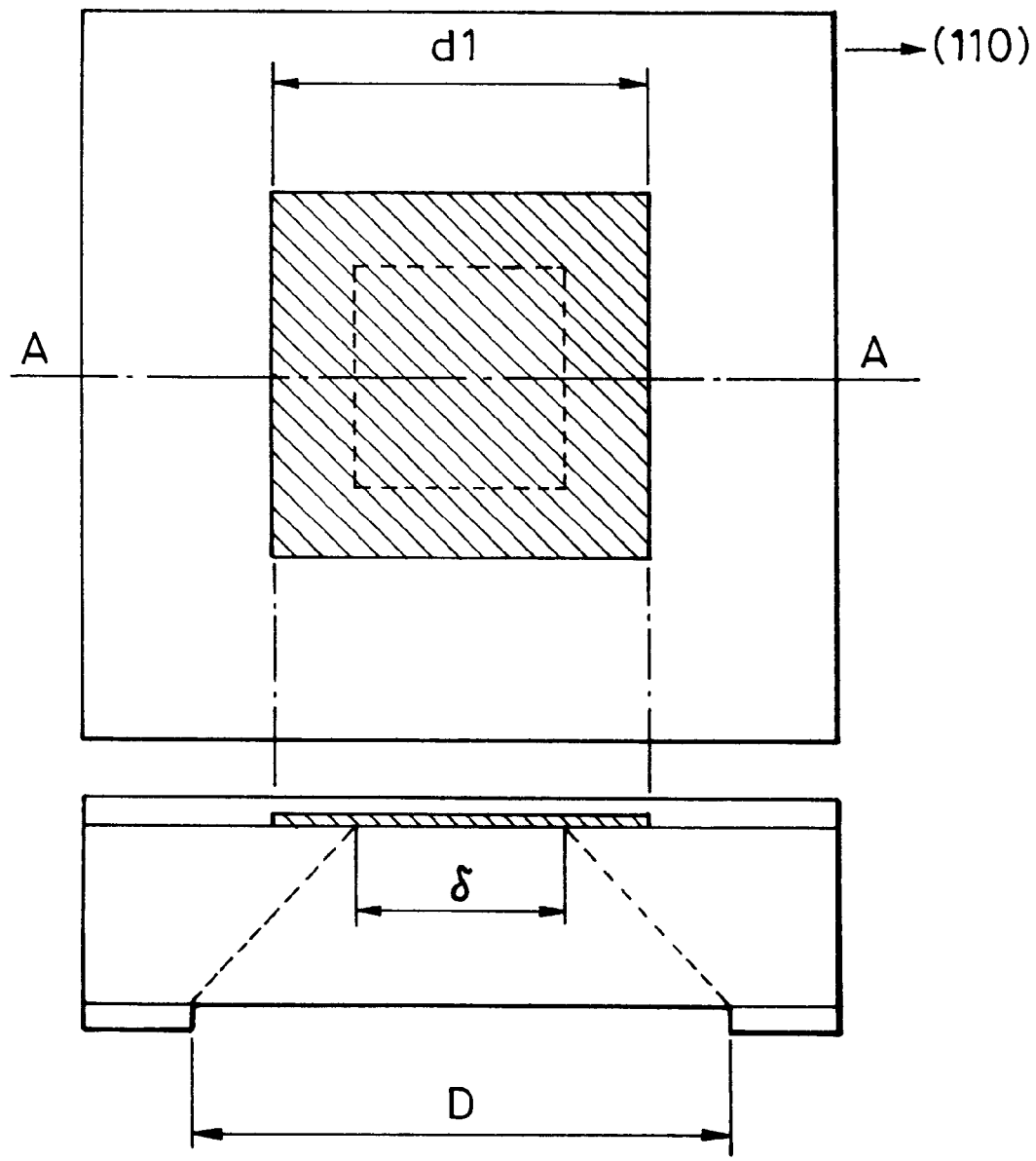
FIG. 5 is a cross-sectional view illustrating the pattern and the layout of a dummy layer according to the second embodiment of the invention.
Figure 6A:
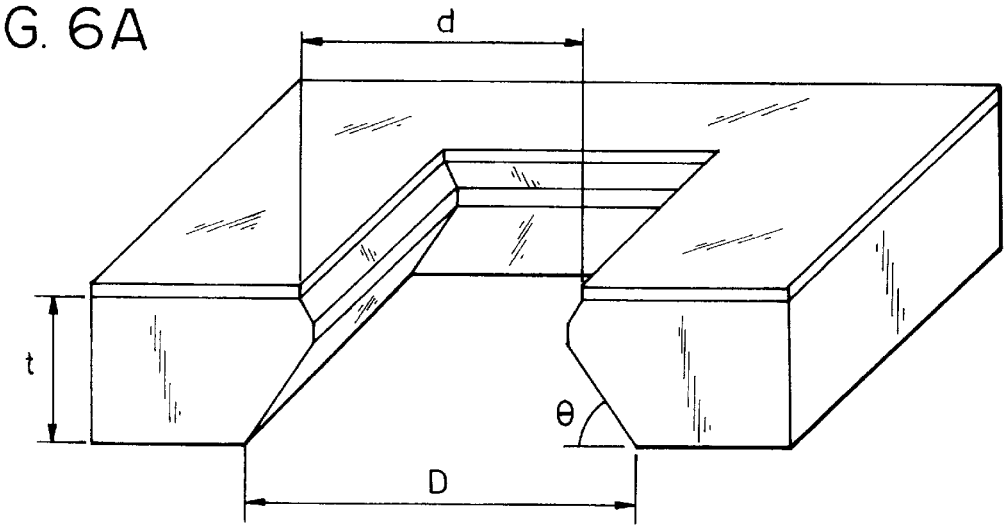
FIG. 6 is a perspective view illustrating a through-hole according to the second embodiment of the invention.
Figure 6B:
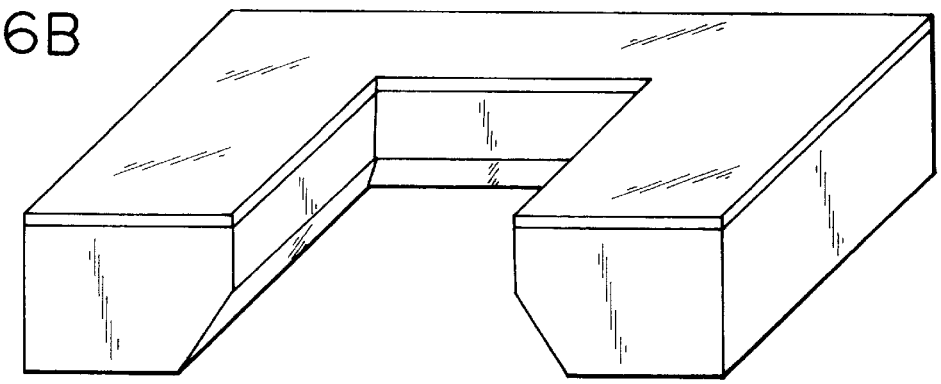
Figure 6C:
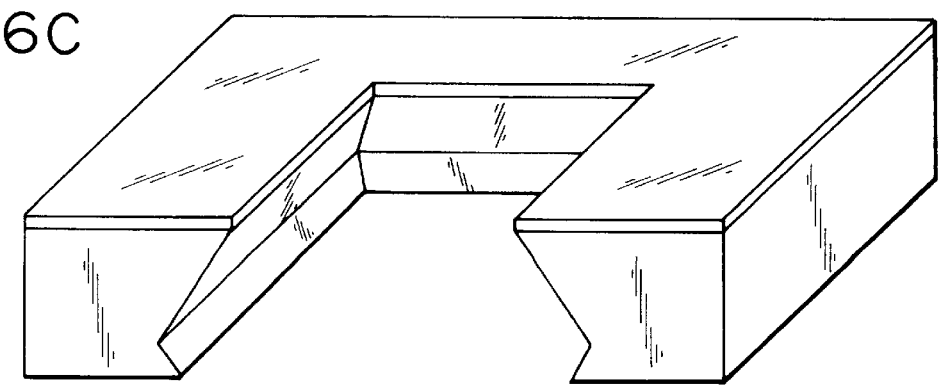

FIG. 4 is a cross-sectional view illustrating the processing steps of producing a through-hole according to the present invention. FIG. 5 is a top view and cross-sectional view of a substrate on which there is provided a porous silicon layer serving as a dummy layer 11 by which the through-hole is produced. FIG. 6A is a perspective view illustrating an example of the characteristic structure of a through-hole seen from its cross section. As shown in FIGS. 6A to 6C, the through-hole according to the present invention is characterized in that it has a bent shape in cross section unlike the conventional through-hole shown in FIG. 20 having a trapezoidal shape in cross section. In the production method according to the invention, it is possible to form the through-hole into a desired shape in cross section by controlling the etching time such that the cross section has either an outward-bent shape or an inward-bent shape as shown in FIGS. 6A to 6C. This makes it possible to control the fluid conductance of a nozzle surrounded by (111) crystal surfaces to a desired value, which could not be achieved by the conventional technique.

The method of producing a through-hole according to the second embodiment of the invention will be described below with reference to FIG. 4. A silicon nitride film having a thickness of 500 nm was formed by means of LPCVD (low pressure chemical vapor deposition) on the principal surface and the back surface of a (100) silicon substrate 10 having a thickness of 525 μm, wherein the silicon nitride film was to serve in the subsequent process step as a mask layer 13 through which the silicon substrate 10 would be etched from its back side by a crystal orientation-dependent etchant. The mask layer 13 on the back surface of the substrate was partially removed by means of reactive ion etching using $CF_4$ gas through a photoresist formed by a photolithographic process thereby forming an opening 14 in the mask layer 13 so that the silicon surface was exposed through the opening 14 of the mask layer 13. The photoresist was then removed. After removing the silicon nitride film from the surface of the substrate by means of reactive ion etching using $CF_4$ gas, a thin Cu film serving as a dummy layer 11 was deposited to a thickness of 3 μm. The thin Cu film was then etched by aqueous ferric chloride (20%) through a photoresist formed by a photolithographic process. After completion of the etching, the photoresist was removed. Thus, the dummy layer 11 was formed as shown in FIG. 4A. FIG. 5 illustrates the pattern of the dummy layer seen from the upper side of the substrate. In this embodiment, as shown in FIG. 5, the pattern of the dummy layer has a square shape each side of which has a length of d1. The length D of the opening 14 was determined so that the length δ of each side of a square represented by a broken line in the top view of FIG. 5, which would be obtained at the principal surface of the silicon substrate when the silicon substrate was etched thoroughly through it by a crystal orientation-dependent anisotropic etchant, was smaller than the length d1 of the porous silicon layer serving as the dummy layer.

A 500 nm amorphous silicon nitride (a-SiN) film serving as a passivation film 12 was then formed (FIG. 4A).

Figure 4C:
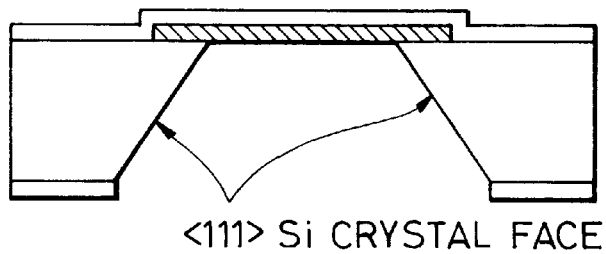
Figure 4D:
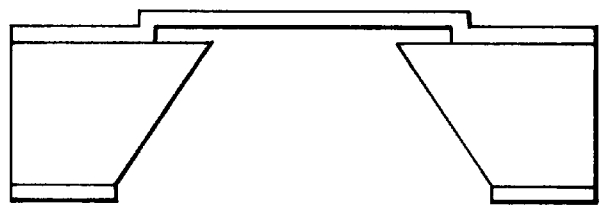
Figure 4E:
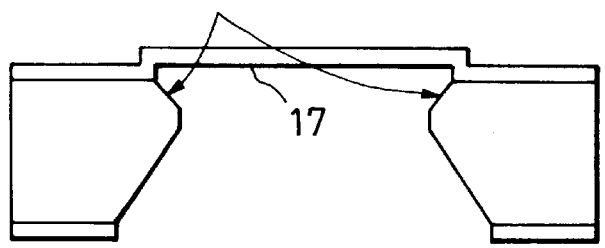
Figure 4F:
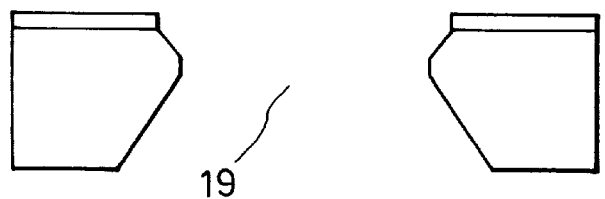

After removing the photoresist, the silicon substrate was subjected to crystal orientation-dependent anisotropic etching using an aqueous solution of 27% potassium hydroxide (KOH) at a solution temperature of 90° C. so as to form a pyramid-shaped hole surrounded by (111) crystal surfaces (FIG. 4C). The Cu dummy layer exposed via the pyramid-shaped hole was removed by means of isotropic etching using aqueous ferric chloride (20%) (FIG. 4D). Subsequently, the part of silicon which had been covered by the dummy layer was etched by means of a crystal orientation-dependent anisotropic etching process using an aqueous solution of KOH thereby forming a membrane of passivation film (FIG. 4E). The membrane of passivation film was then removed by performing ion etching using $CF_4$ gas from the back side of the substrate thereby forming a through-hole (FIG. 4F).

In FIG. 4E, in the case where the crystal orientation-dependent anisotropic etching was further continued, the outward-projecting portion in cross section of the substrate was etched and thus the resultant through-hole had a vertical side wall below the dummy layer as shown in FIG. 6B. When the etching was further continued, the resultant through-hole had a shape surrounded by (111) crystal surfaces as shown in FIG. 6C. Also in the through-hole having such a cross-sectional shape, the opening length d was not affected by the variation in the substrate thickness.

Third Embodiment

Figure 7:
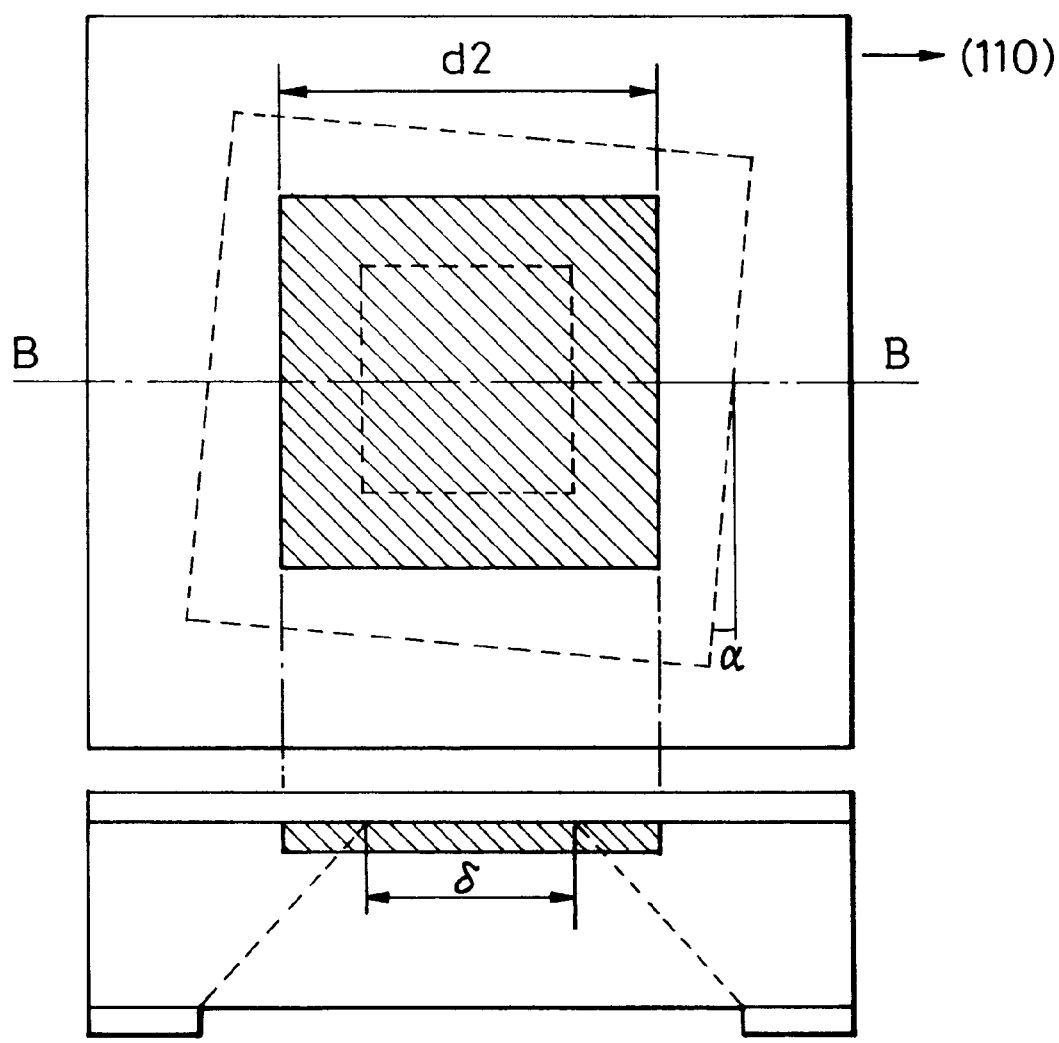
FIG. 7 is a cross-sectional view illustrating the pattern and the layout of an embedded dummy layer according to a third embodiment of the invention.

FIG. 7 is a top view and cross-sectional view of a substrate on which an embedded dummy layer was formed in accordance with the third embodiment of the present invention. In this embodiment, as shown in FIG. 7, the pattern of the embedded dummy layer seen from the upper side of the substrate has the shape of a square each side of which has a length of d2. A though-hole was produced using a similar process to that employed in the first embodiment except that a back-side opening was formed such that it is offset from the (110) orientation by an angle of α. In this specific embodiment, α was set to 1°. d2 and δ determined by the size of the back-side opening have relationship given by replacing d1 in inequality (3) by d2.

At the principal surface of the substrate, the opening part of the produced through-hole had the shape of a square each side of which had a length d substantially equal to d2. That is, the length d was determined by the shape of the embedded dummy layer without being affected by the angle α. According to the method of producing a through-hole of the present embodiment, as described above, it is possible to obtain a through-hole having an opening length precisely controlled to a desired value d regardless of the variation in the orientation flat angle from wafer to wafer or from lot to lot.

Fourth embodiment

Figure 8:
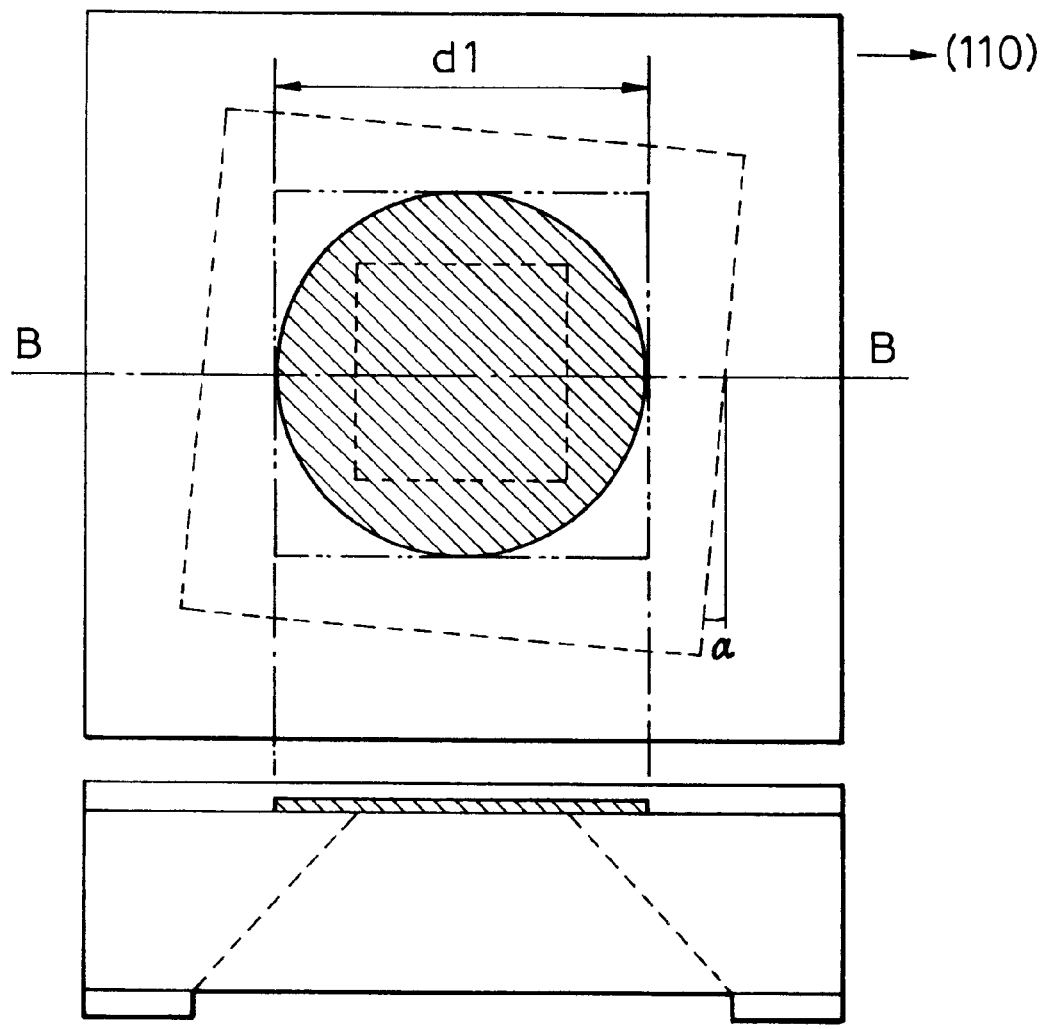
FIG. 8 is a cross-sectional view illustrating the pattern and the layout of a dummy layer according to a fourth embodiment of the invention.

FIG. 8 is a top view and cross-sectional view of a substrate on which a dummy layer used in the present invention was formed. In this embodiment, the dummy layer was formed so that its pattern seen from the upper side of the substrate had the shape of a circle with a diameter d1, and a through-hole was produced using a process similar to that employed in the second embodiment except that an opening was formed in the mask layer on the back surface of the substrate such that the orientation of the opening had a deviation from the (110) crystal orientation by an angle of α. In this specific embodiment, α was set to 1°.

At the principal surface of the substrate, the opening end of the produced through-hole had the shape of a square each side of which had a length d as represented by a two-dot chain line in FIG. 8, and thus the length d was determined by the diameter of the embedded dummy layer without being affected by the angle α. According to the method of producing a through-hole of the present embodiment, as described above, it is possible to obtain a through-hole having an opening length precisely controlled to a desired value d regardless of the variation in the orientation flat angle from wafer to wafer or from lot to lot.

Fifth Embodiment

The fifth embodiment of the method of producing a through-hole according to the present invention is described below. In this fifth embodiment, a through-hole was produced in a manner similar to that shown in FIG. 4 except that the dummy layer was made of polycrystalline silicon by means of LPCVD (low pressure chemical vapor deposition), and the passivation layer and the mask layer were made of silicon nitride by means of LPCVD. The silicon substrate was anisotropically etched using an aqueous solution of KOH so that the dummy layer was exposed. The etching was continued further so that the dummy layer was isotropically etched by the aqueous solution of KOH and silicon under the dummy layer was etched by means of a crystal orientation-dependent anisotropic etching process thereby forming a membrane of passivation film similar to that shown in FIG. 4E. Subsequently, reactive etching was performed from the back side of the substrate using $CF_4$ gas so as to remove the passivation film thereby forming a through-hole similar to that shown in FIG. 4F. The opening length of the produced through-hole was similar to that obtained in the second embodiment, and the opening length d of the through-hole could be precisely controlled regardless of the materials of the dummy layers and passivation layers.

Sixth Embodiment

Figure 9A:
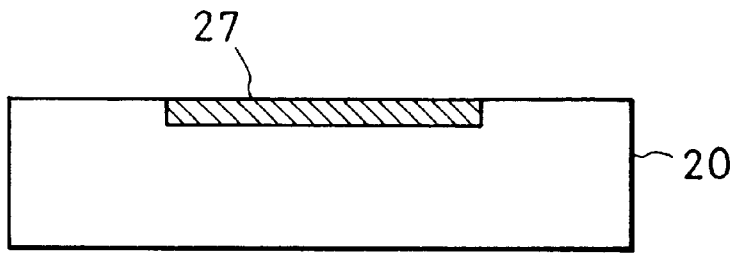
FIG. 9 is a cross-sectional view illustrating the processing steps of producing a thin-film cantilever using the method of producing a through-hole according to the present invention.
Figure 9B:
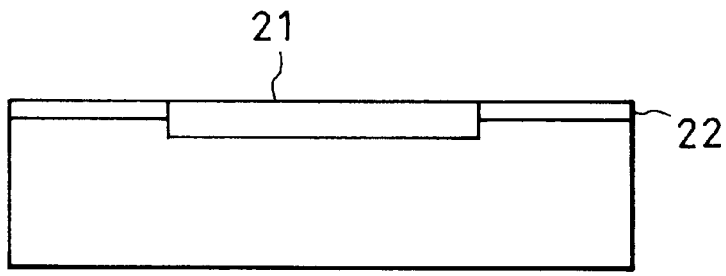

In this embodiment, a thin-film cantilever was produced using a technique based on the method of producing a through-hole according to the invention. The produced thin-film cantilever can be used as a probe in an SPM. FIG. 10 is a perspective view of the thin-film cantilever produced. Unlike the conventional thin-film cantilever supported by a silicon block having a cross-sectional shape whose contour is straight as represented by the broken line in FIG. 10, the silicon block 28 for supporting the thin-film cantilever 26 in this embodiment has a bent contour in cross section. It is required that the silicon block should have a sufficiently large size so that it can be handled in the process of mounting the cantilever on an AFM apparatus. With the technique of producing a thin-film cantilever according to the invention disclosed herein with reference to FIG. 10, it is possible to obtain a cantilever having a desired length using a rather small opening compared to that employed in the conventional technique, and thus it is possible to reduce the chipping size of the silicon block. This makes it possible to produce a greater number of cantilevers from one silicon wafer and thus the production cost per probe can be reduced. The method of producing the cantilever employed in this embodiment of the invention will be described below with reference to FIG. 9. Porous silicon 27 was formed on an n-type <100> silicon substrate 20 having a thickness of 525 μm and a resistivity of 0.02 Ω·cm in a manner similar to that employed in the first embodiment (FIG. 9A). The silicon substrate 20, on which the porous silicon 27 was formed, was then thermally oxidized using oxidization gas so that an embedded dummy layer 21 of silicon dioxide was formed. When the embedded dummy layer was formed, a silicon dioxide layer was also formed in the other area on the silicon substrate (FIG. 9B). In this embodiment, this silicon dioxide layer was employed as a passivation layer 22.

Figure 9C:
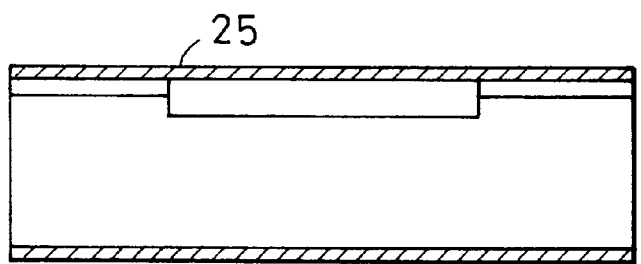
Figure 9D:
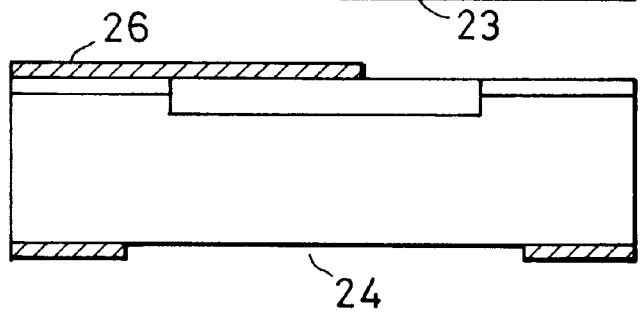
Figure 10:
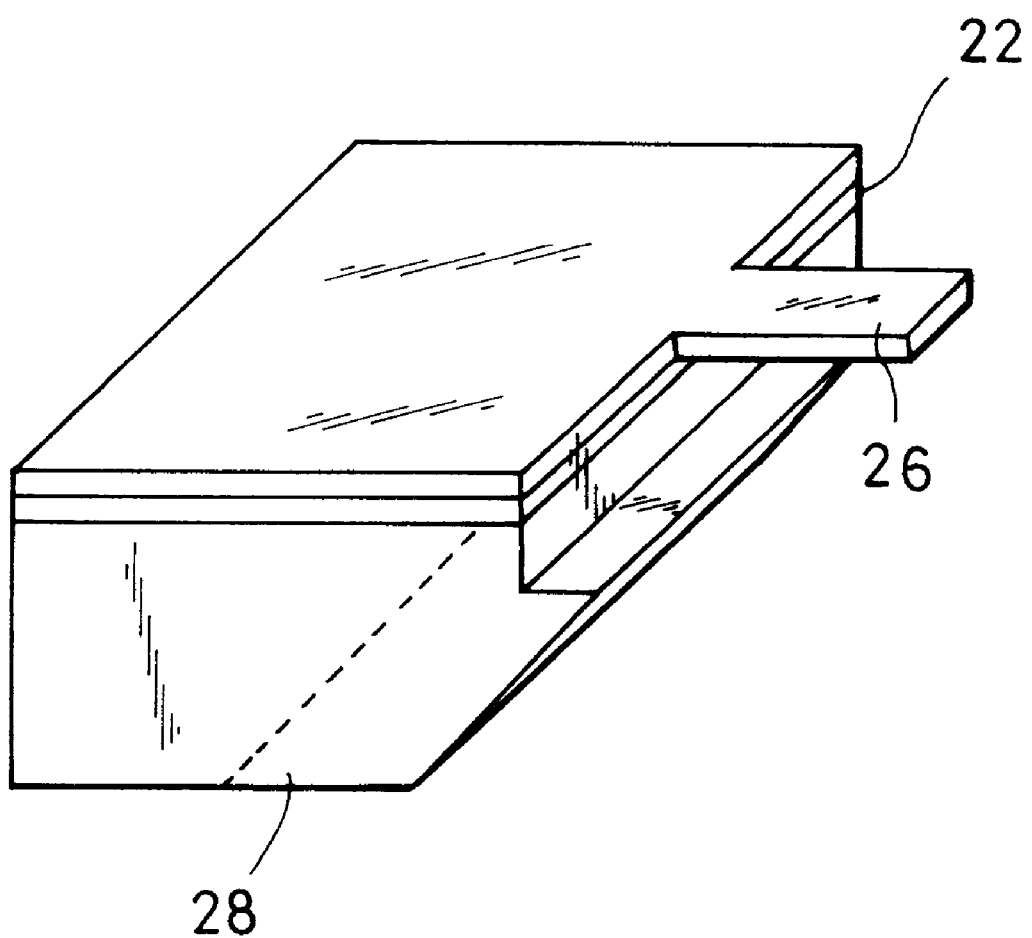
FIG. 10 is a perspective view illustrating a thin-film cantilever according to a sixth embodiment of the invention.

Subsequently, silicon nitride films serving as a structure layer 25 and as a mask layer 23 used in a later step to etch the silicon substrate 20 from its back side by means of a crystal orientation-dependent anisotropic etching process were formed to thickness of 500 nm by means of LPCVD (FIG. 9C). The mask layer 23 on the back surface of the substrate was subjected to reactive ion etching using $CF_4$ gas via a photoresist mask formed by a photolithographic process, and the photoresist was then removed thereby forming an opening 24 in the mask layer 23 so that the silicon substrate was exposed via the opening 24. The structure layer was patterned into the shape of a thin-film cantilever 26 using a process similar to that employed to form the opening 24 (FIG. 9D).

Figure 9E:
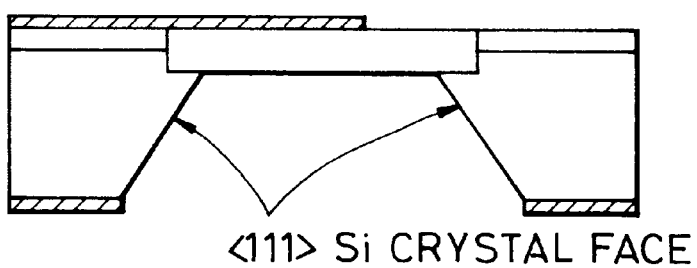
Figure 9F:
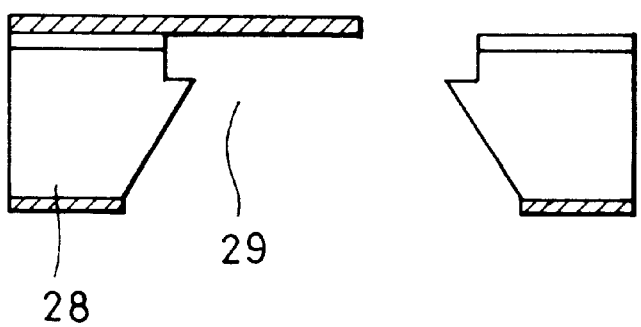

The silicon substrate 20 was etched by an aqueous solution of 22% TMAH serving as a crystal orientation-dependent anisotropic etchant at a solution temperature of 80° C. so as to form a trapezoidal-shaped hole surrounded by (111) crystal surfaces (FIG. 9E). The embedded dummy layer 21 was removed by means of etching with buffered hydrofluoric acid so as to form a through-hole 29 (FIG. 9F). Finally, the silicon substrate was separated into silicon blocks 28 so as to obtain thin-film cantilevers having the structure shown in FIG. 10.

To investigate the effects of the concentration of the aqueous solution of TMAH used as the etchant, a silicon substrate having the same structure as that shown in FIG. 9E was also etched by means of a crystal orientation-dependent anisotropic etching process using an aqueous solution of 10% TMAH at a solution temperature of 80° C., and was then formed into the shape of a thin-film cantilever in the subsequent process shown in FIG. 9F. The result showed that a through-hole having a similar size could be obtained regardless of the concentration of the crystal orientation-dependent anisotropic etchant. Thus, according to the method of the present invention disclosed in this embodiment, it is possible to precisely control the opening length of the through-hole thereby obtaining a thin-film cantilever having a length precisely controlled to a desired value.

Seventh Embodiment

Figure 12:
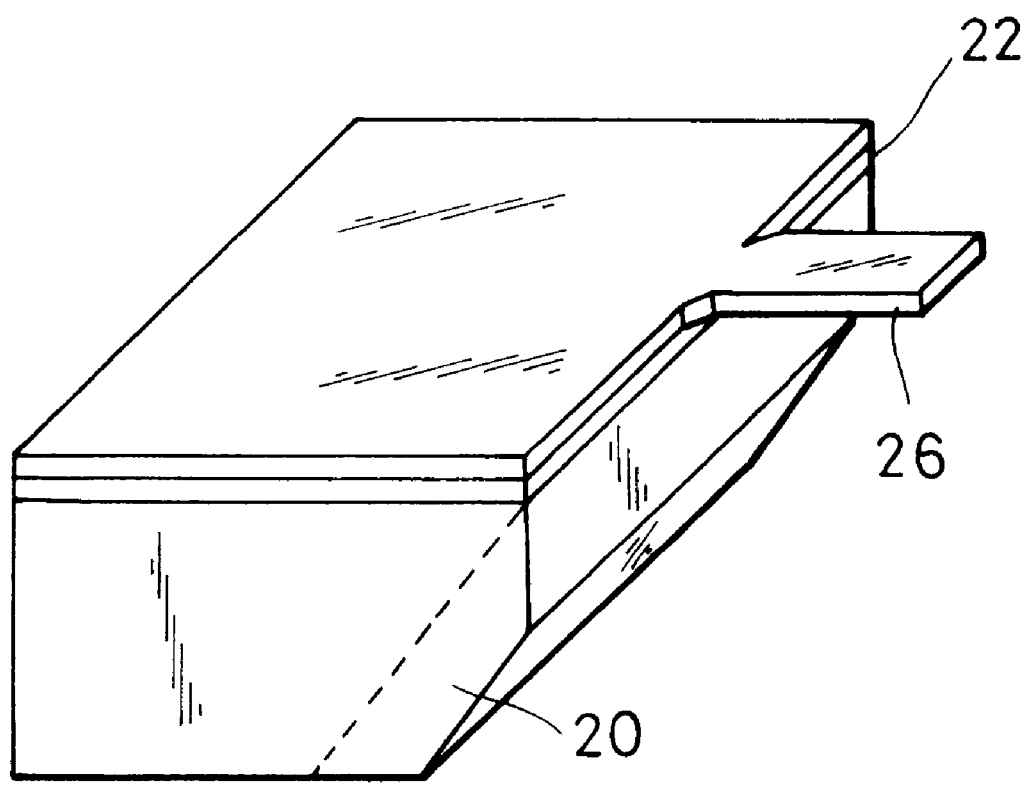
FIG. 12 is a perspective view illustrating a thin-film cantilever according to a seventh embodiment of the invention.

In this embodiment, a thin-film cantilever was produced using a technique based on the method of producing a through-hole according to the invention. The produced thin-film cantilever can be used as a probe in an SPM. FIG. 12 is a perspective view of the thin-film cantilever produced. Unlike the conventional thin-film cantilever supported by a silicon block having a cross-sectional shape whose contour is straight as represented by the broken line in FIG. 12, the silicon block 28 for supporting the thin-film cantilever 26 in this embodiment has a bent contour in cross section. It is required that the silicon block should have a sufficiently large size so that it can be handled in the process of mounting the cantilever on an AFM apparatus. With the technique of producing a thin-film cantilever according to the invention disclosed herein with reference to FIG. 12, it is possible to obtain a cantilever having a desired length using a rather small opening compared to that employed in the conventional technique, and thus it is possible to reduce the chipping size of the silicon block. This makes it possible to produce a greater number of cantilevers from one silicon wafer and thus the production cost per probe can be reduced.

The method of producing the cantilever employed in this embodiment of the invention will be described below with reference to FIG. 11. A polycrystalline silicon film serving as a dummy layer 21 with a thickness of 500 nm was formed by means of LPCVD (low pressure chemical vapor deposition) on the principal surface of a <100> silicon substrate 20 having a thickness of 525 μm. The polycrystalline silicon film was subjected to reactive ion etching using $CF_4$ gas via a photoresist mask formed by a photolithographic process. After completion of the reactive ion etching, the photoresist was removed. Thus, the dummy layer 21 was obtained.

Figure 11A:
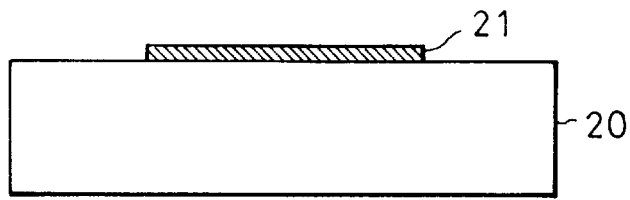
FIG. 11 is a cross-sectional view illustrating the processing steps of producing a thin-film cantilever using the method of producing a through-hole according to the present invention.
Figure 11B:
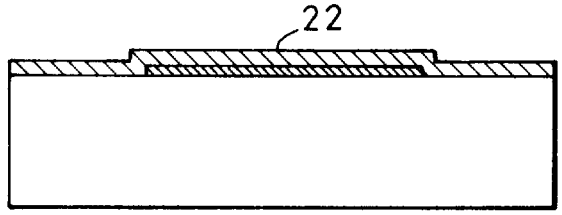
Figure 11C:
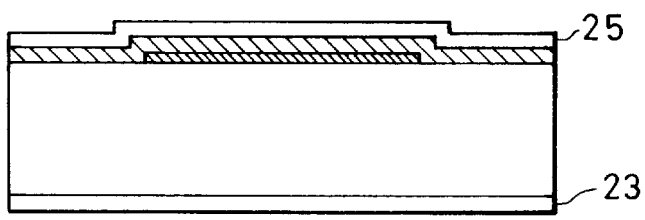

The silicon substrate 20 was then thermally oxidized in oxidization gas so as to form a passivation film 22 with a thickness of 300 nm on the surface of the substrate and also on the surface of the dummy layer (FIG. 11B). Subsequently, silicon nitride films serving as a structure layer 25 and as a mask layer 23 used in a later step to etch the silicon substrate 20 from its back side by means of a crystal orientation-dependent anisotropic etching process were formed to thickness of 500 nm by means of LPCVD (FIG. 11C). The mask layer 23 on the back surface of the substrate was subjected to reactive ion etching using $CF_4$ gas via a photoresist mask formed by a photolithographic process, and the photoresist was then removed thereby forming an opening 24 in the mask layer 23 so that the silicon substrate was exposed via the opening 24. The structure layer was patterned into the shape of a thin-film cantilever 26 using a process similar to that employed to form the opening 24 (FIG. 11D).

The silicon substrate 20 was etched by an aqueous solution of 22% TMAH serving as a crystal orientation-dependent anisotropic etchant at a solution temperature of 80° C. so as to form a trapezoidal-shaped hole surrounded by (111) crystal surfaces. The etching was continued further so that the dummy layer 21 was isotropically etched by the aqueous solution of TMAH and silicon under the dummy layer was etched in a crystal orientation-dependent anisotropic fashion (FIG. 11E) thereby forming a membrane of passivation film after completely removing the dummy layer (FIG. 11F). Subsequently, the passivation film 22 was etched using an aqueous solution of HF so as to remove the membrane 27 thereby forming a through-hole (FIG. 11G). Finally, the silicon substrate was separated into silicon blocks 28 so as to obtain thin-film cantilevers (refer to FIG. 12).

Figure 11D:
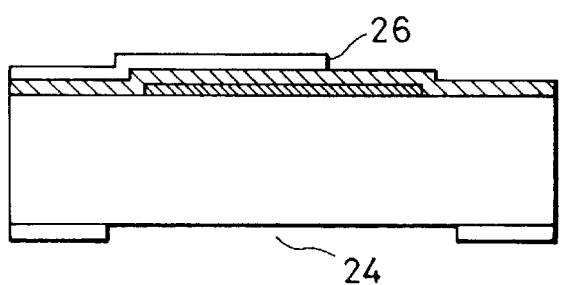
Figure 11E:
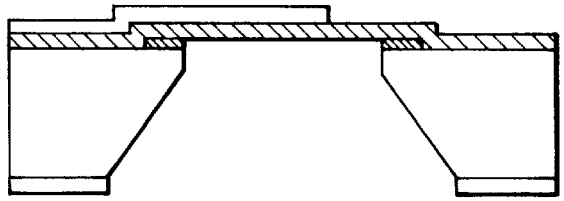
Figure 11F:
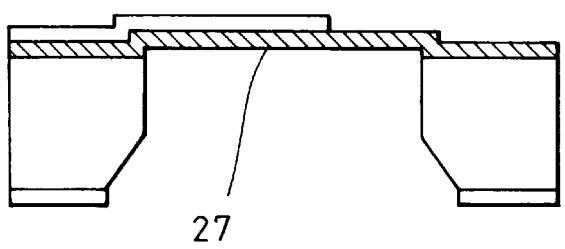
Figure 11G:
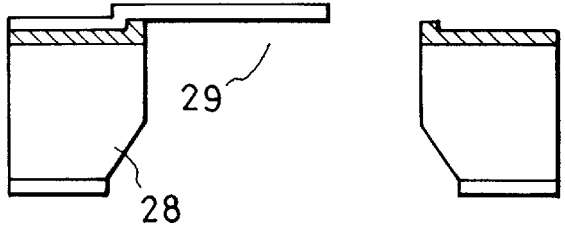

To investigate the effects of the concentration of the aqueous solution of TMAH used as the etchant, a silicon substrate having the same structure as that shown in FIG. 11D was also etched in a crystal orientation-dependent anisotropic fashion using an aqueous solution of 10% TMAH at a solution temperature of 80° C., and was then formed into the shape of a thin-film cantilever in the subsequent processing steps shown in FIGS. 11E to 11F. The result showed that a through-hole having a similar size could be obtained regardless of the concentration of the crystal orientation-dependent anisotropic etchant. Thus, according to the method of the present invention disclosed in this embodiment, it is possible to precisely control the opening length of the through-hole thereby obtaining a thin-film cantilever having a length controlled to a desired value.

Eighth Embodiment

In this embodiment, a piezoresistance cantilever was formed on an SOI substrate having the structure shown in FIG. 20, using the method of producing a through-hole according to the present invention. FIGS. 13 and 14 illustrate the processing steps of producing the piezoresistance cantilever, wherein these figures include top views and cross-sectional views taken along lines represented in the top views.

Figure 13A:
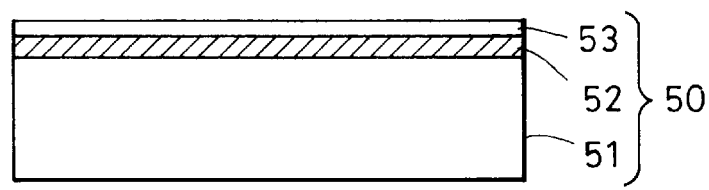
FIG. 13 is a cross-sectional view illustrating the processing steps of producing a piezoresistance cantilever according to an eighth embodiment of the invention.
Figure 13B:
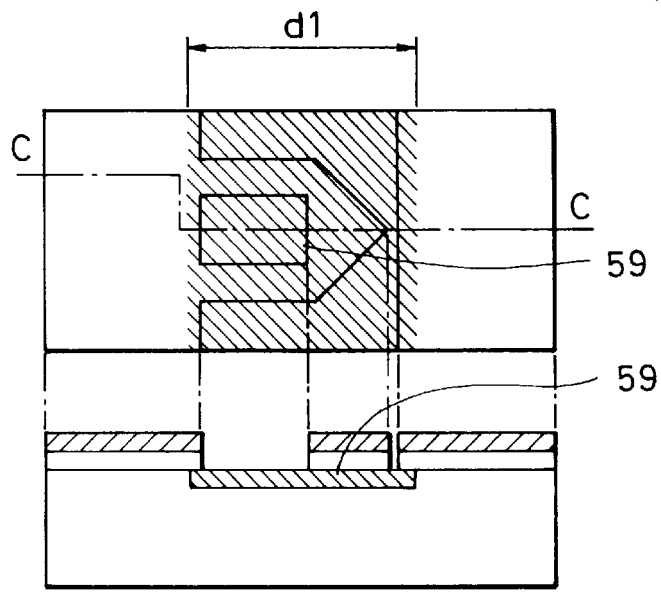
Figure 13C:
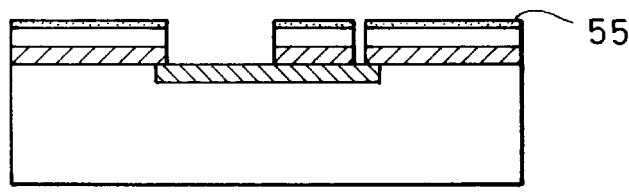
Figure 13D:
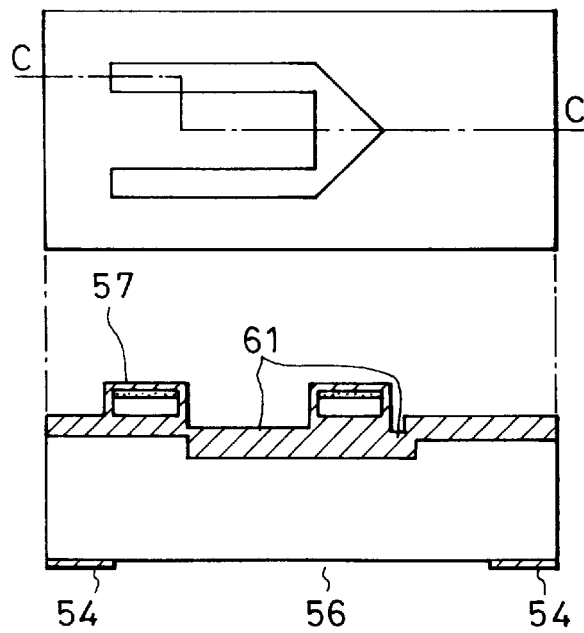
Figure 14E:
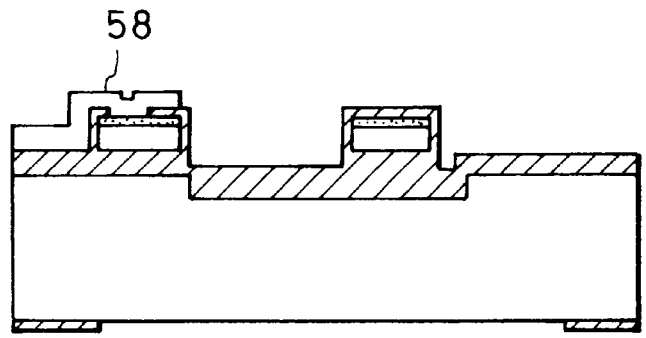
FIG. 14 is a cross-sectional view illustrating the processing steps of producing a piezoresistance cantilever according to the eighth embodiment of the invention.
Figure 14F:
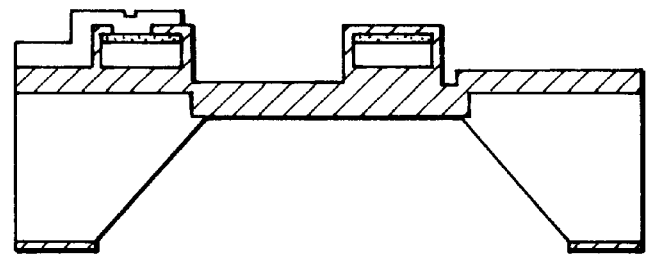
Figure 14G:
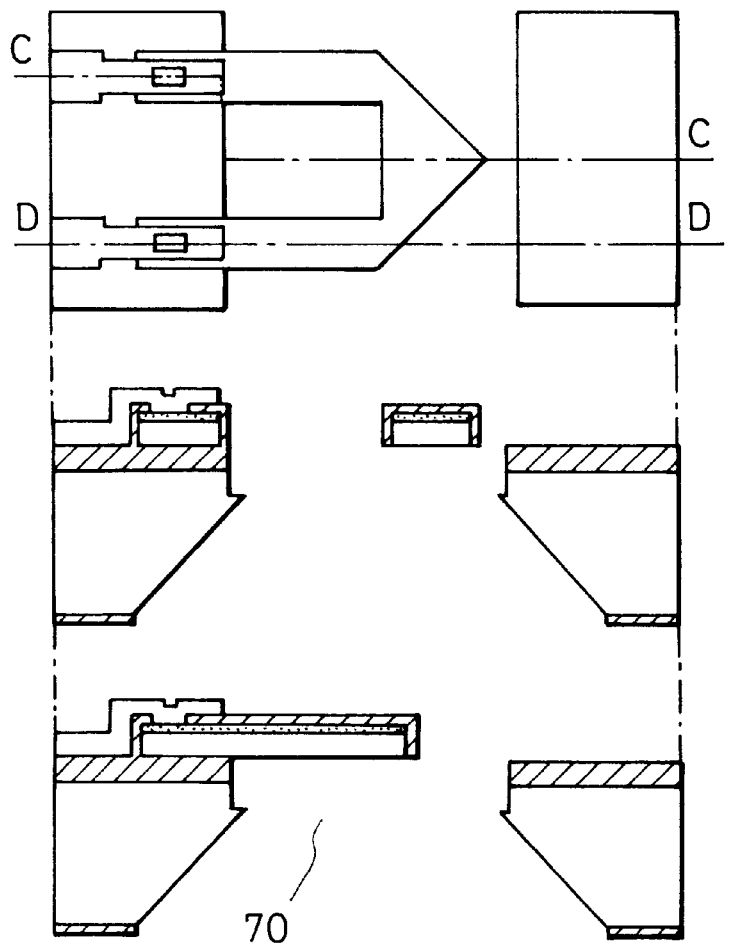

In this embodiment, an SOI wafer 50 similar to that shown in FIG. 20, comprising a p-type silicon substrate 51 and a silicon dioxide layer 52 and an n-type silicon layer 53 formed on the substrate 51, was employed (FIG. 13A). The n-type silicon layer 53 was partially removed as shown in FIG. 13B by means of reactive ion etching using $CF_4$ gas in conjunction with a photolithographic process so that the silicon dioxide layer 52 was partially exposed. The exposed portion of the silicon dioxide layer 52 was then etched using buffered hydrofluoric acid. Using the n-type silicon layer 53 as a mask (represented by a solid line in FIG. 13B) having resistance to hydrofluoric acid, anodization was performed using the p-type silicon substrate 51 as an electrode so as to form a porous silicon layer 59 to a depth of 30 μm (as represented by the hatched area in FIG. 13B). The anodization was performed for a sufficiently long time so that the porous silicon region extended in a lateral direction and thus the regions of the p-type silicon substrate below the portion of the n-type silicon layer which would become the cantilever were also converted to porous silicon. Subsequently, boron (B) was implanted and diffused into the n-type silicon layer so as to form a resistor 55 (FIG. 13C). The n-type silicon layer 53 and the silicon dioxide layer 52 were then patterned into the form of a cantilever by means of etching in conjunction with a photolithographic process. The porous silicon layer 59 was then thermally oxidized in oxidization gas so as to form a silicon dioxide layer serving as an embedded dummy layer 61. When the embedded dummy layer was formed, the surface of the resistor 55 and the back surface of the silicon substrate were also oxidized and thus a thin silicon dioxide film 57 and a silicon dioxide layer 54 were also formed. An opening 56 for use in an anisotropic etching process was formed in the silicon dioxide layer 54 on the back surface of the silicon substrate (FIG. 13D). A contact hole was then formed in the thin silicon dioxide film 57, and an Al metal electrode 58 was formed (FIG. 14E). The p-type silicon substrate was anisotropically etched from its back side using EDP serving as a crystal orientation-dependent anisotropical etchant via the opening 56 until the embedded dummy layer 61 was exposed via a hole surrounded by (111) crystal surfaces (FIG. 14F). Subsequently, the membrane portion of the embedded dummy layer 61 was removed by means of etching using buffered hydrofluoric acid thereby forming a through-hole thus obtaining a piezoresistance cantilever (FIG. 14G).

In the present invention, the opening length d of the through-hole measured at the surface of the substrate is determined by the width d1 of the embedded dummy layer without being affected by the variations in the substrate thickness and the orientation flat angle. Therefore, it is possible to produce a cantilever with a desired length with high reproducibility, and thus it is possible to produce a piezoresistance cantilever with small variations in mechanical characteristics such as the resonance frequency and the spring constant.

Ninth Embodiment

In this embodiment, a piezoresistance cantilever was formed on an SOI substrate having the structure shown in FIG. 20, using the method of producing a through-hole according to the present invention. FIGS. 15 and 16 illustrate the processing steps of producing the piezoresistance cantilever, wherein these figures include top views and cross-sectional views taken along lines represented in the top views.

Figure 15A:
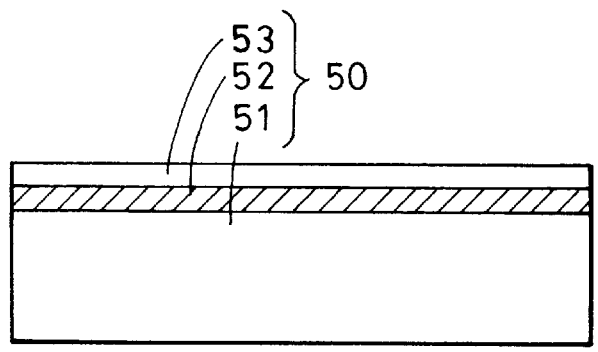
FIG. 15 is a cross-sectional view illustrating the processing steps of producing a piezoresistance cantilever according to a ninth embodiment of the invention.
Figure 15B:
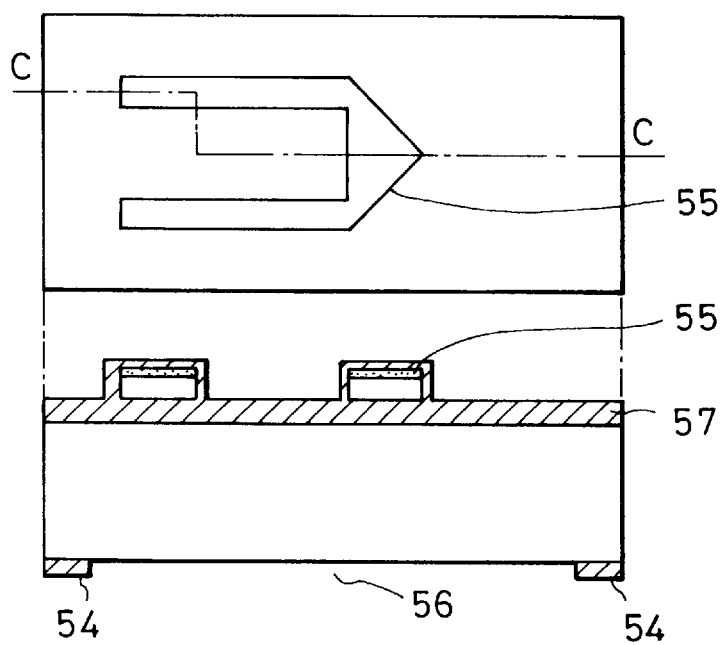
Figure 15C:
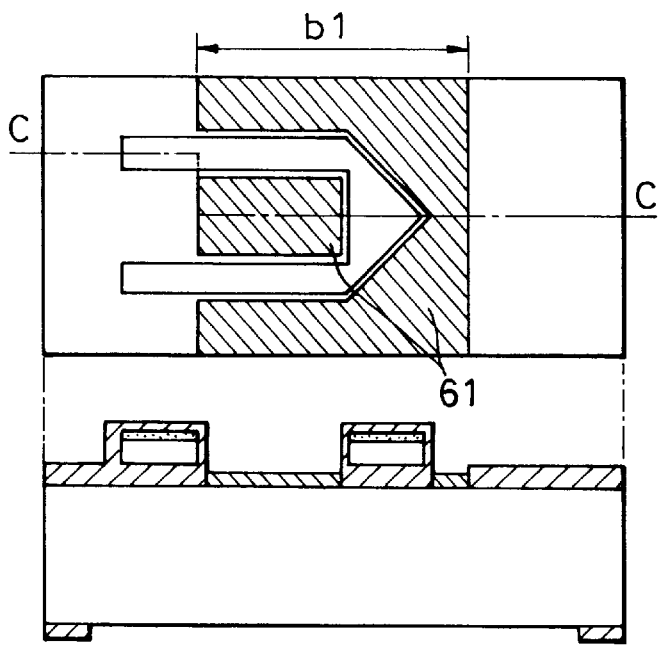
Figure 16D:
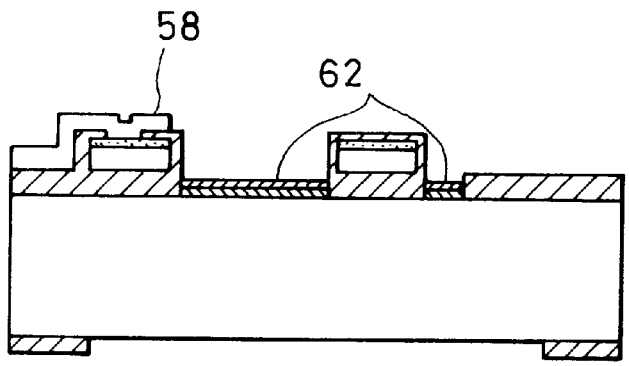
FIG. 16 is a cross-sectional view illustrating the processing steps of producing a piezoresistance cantilever according to the ninth embodiment of the invention.
Figure 16E:
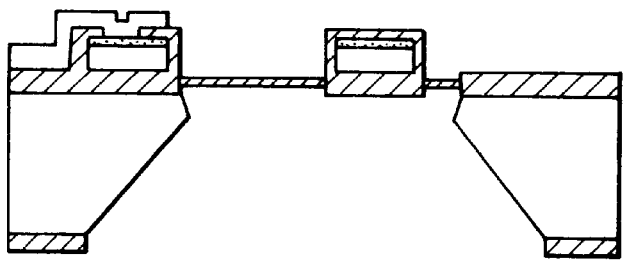
Figure 16F:
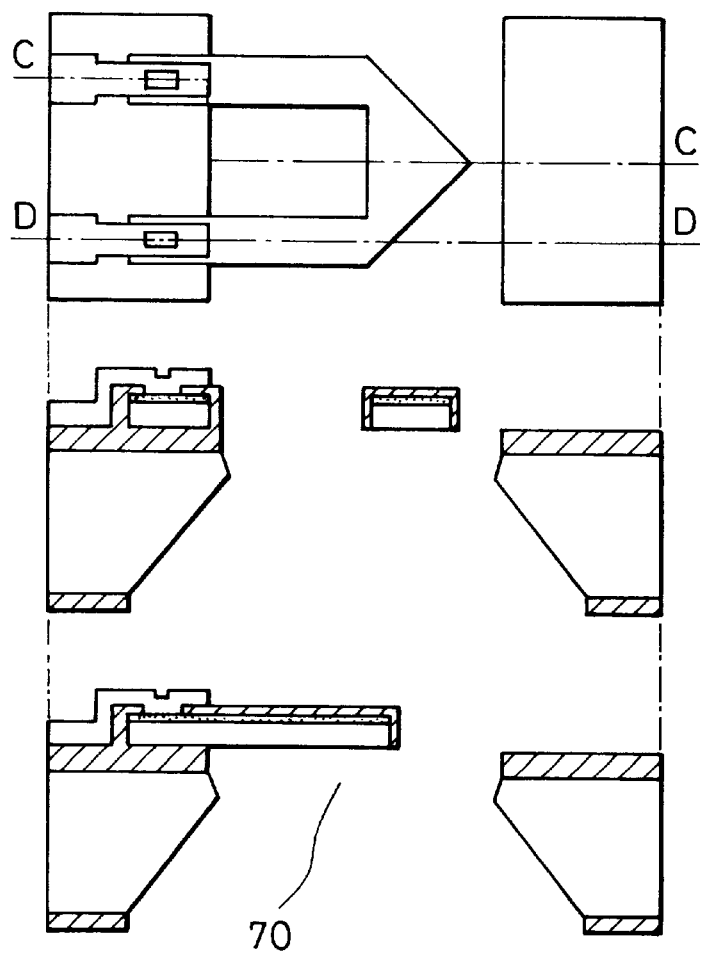

In this embodiment, an SOI wafer 50 similar to that shown in FIG. 20, comprising a p-type silicon substrate 51 and a silicon dioxide layer 52 and an n-type silicon layer 53 formed on the substrate 51, was employed (FIG. 15a). After forming a silicon dioxide film 54 by means of thermal oxidation, the silicon dioxide film on the principal surface of the SOI wafer was removed using an aqueous solution of HF, and boron (B) was implanted and diffused into the n-type silicon layer so as to form a resistor 55 (FIG. 15b). By means of etching in conjunction with a photolithographic process, the n-type silicon layer was patterned into the shape of a cantilever, and an opening 56 was formed in the silicon dioxide film 54 on the back surface of the SOI wafer. A thin silicon dioxide film 57 was then formed on the cantilever pattern. The thin silicon dioxide film 57 was partially removed by means of etching using an aqueous solution of HF, and a dummy layer 61 was formed in the area on the silicon substrate exposed via the thin silicon dioxide film 57 (FIG. 15C). The dummy layer 61 was realized by depositing a polycrystalline silicon film by means of LPCVD. A thin silicon dioxide film serving as a passivation layer 62 was then formed over the entire surface of the substrate by means of sputtering. A contact hole was formed in the passivation layer 62 and an Al metal electrode 58 was formed (FIG. 16D). The p-type silicon substrate was etched using EDP serving as a crystal orientation-dependent anisotropical etchant via the opening 56 so as to form a hole surrounded by (111) crystal surfaces. Subsequently, the dummy layer 61 was isotropically etched using EDP. During this etching process, the part of the silicon substrate under the dummy layer was also etched. Thus, the dummy layer was completely removed, and the part of the silicon substrate under the cantilever was removed (FIG. 16E). Furthermore, the passivation film 22 was partially removed by means of etching using an aqueous solution of HF so as to form a through-hole thereby forming a piezoresistance cantilever (FIG. 16F).

The opening length d of the through-hole measured at the surface of the substrate is determined by the width d1 of the dummy layer shown in FIG. 15 without being affected by the variations in the substrate thickness and the orientation flat angle. Therefore, it is possible to produce a cantilever with a desired length with high reproducibility, and thus it is possible to produce a piezoresistance cantilever with small variations in mechanical characteristics such as the resonance frequency and the spring constant.

Tenth Embodiment

In this embodiment, an ink-jet print head was produced using the method of producing a through-hole according to the present invention. First, the general construction of an ink-jet print head to which the present invention can be applied is described.

Figure 17:
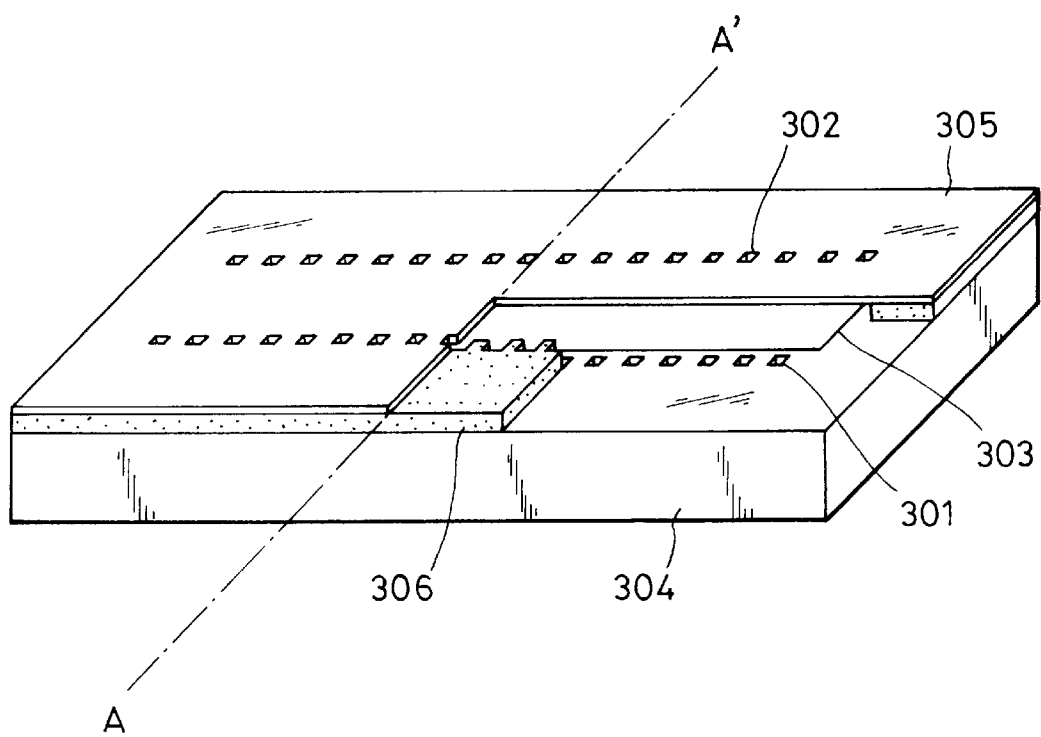
FIG. 17 is a schematic diagram illustrating an example of an ink-jet print head to which the present invention can be applied.

FIG. 17 is a partially cutaway schematic diagram illustrating an example of an ink-jet print head which can be produced according to the present invention, wherein electric interconnections for driving electrothermal conversion elements are not shown in the figure for simplicity.

In FIG. 17, reference numeral 304 denotes a silicon substrate having emission energy generators 301 and an ink supplying hole 303. Eletrothermal conversion elements serving as the emission energy generators 301 are disposed in line at both longer sides of the long rectangular-shaped opening end of the ink supplying hole 303 in such a manner that the electrothermal conversion elements are located in a staggered fashion and the elements in each line are spaced 300 dpi apart. A cover resin layer 306 serving as an ink path wall forming an ink flow path is provided on the substrate 304. An emission hole plate 305 having emission holes 302 is provided on the cover resin layer 306. Although in this specific example shown in FIG. 17, the cover resin layer 306 and the emission hole plate 305 are constructed in the form of separate elements, they may also be constructed in an integrated fashion by forming the cover resin layer 306 on the substrate 304 by means of spin coating or the like.

In this embodiment, the ink supplying hole is produced using the method of producing a through-hole according to the present invention.

When the ink supplying hole of the ink-jet print head having the above structure is produced by means of anisotropic etching, the diameter of the through-hole (ink supplying hole) can vary from head to head, as described earlier, due to the variations in the substrate thickness, the orientation flat angle, and the concentration of the etchant. The variation in the diameter of the ink supplying hole causes a variation in the distance between the emission energy generators and the ink supplying hole, which in turn causes variations in the ink supplying characteristics among the emission energy generators. As a result, the operating frequency characteristics of the ink-jet print head are greatly affected. In the ink-jet print head having the above structure, for the above reason, it is important to precisely control the distance between the emission energy generators and the ink supplying hole. This requirement can be met by applying the method of producing a through-hole according to the present invention to the production of the ink supplying hole. That is, the present invention can provide a high-quality ink-jet print head.

Referring now to FIG. 18, the processing steps employed in this embodiment will be described below, wherein each cross-sectional view in FIG. 18 is taken along line A-A' of FIG. 17. In FIG. 18, the right-side portion of the substrate is not shown, and thus the actual position of the ink supplying hole is near the center of the substrate.

Figure 18A:
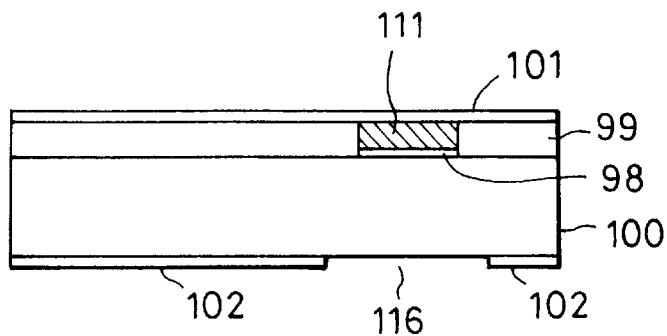
FIG. 18 is a cross-sectional view illustrating the processing steps of producing an ink-jet print head according to a tenth embodiment of the invention.

In this embodiment, a (100) silicon wafer with a thickness of 625 $\mu$m was employed as the substrate. First, to prevent the substrate from being cracked during heat treatment performed later, the substrate was thermally oxidized in oxidization gas thereby forming a silicon dioxide layer on the surface of the substrate. An nMOS well and an insulating diffusion layer was formed by performing a heat treatment under conditions similar to those employed to form a p-well in the CMOS process. More specifically, the substrate was subjected to heat treatment in an oxygen ambient at 1200° C. for 8 hours. The silicon dioxide layer on the substrate was removed using buffered hydrofluoric acid so as to obtain an exposed clean surface of the substrate. The silicon substrate 100 was then subjected to high-temperature treatment in an oxidizing gas ambient so as to again form a silicon dioxide layer by means of thermal oxidation. By means of etching using buffered hydrofluoric acid in conjunction with a photolithographic process, the silicon dioxide layer was removed except for the portion at a location where a through-hole was to be formed, thereby forming an epitaxial growth preventing layer 98. An epitaxial layer 99 was then grown on the surface of the substrate using mono-silane gas with an induction heating epitaxial growth apparatus. During this process, in the area where the epitaxial growth preventing layer 98 was formed, polycrystalline silicon was formed rather than epitaxial silicon. In this embodiment, this polycrystalline silicon was employed as a dummy layer 111. The substrate was further subjected to thermal oxidation using oxidation gas so as to form silicon dioxide layers 101 and 102 on the principal surface and the back surface of the substrate, respectively. The silicon dioxide layer 102 on the back surface of the substrate was partially removed by means of etching using buffered hydrofluoric acid in conjunction with a photolithographic process so as to form an opening 116 in the silicon dioxide layer 102 so that the silicon substrate was exposed via the opening 116 (FIG. 18A).

Figure 18B:
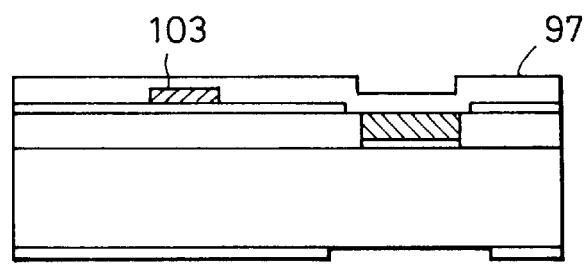
Figure 18C:
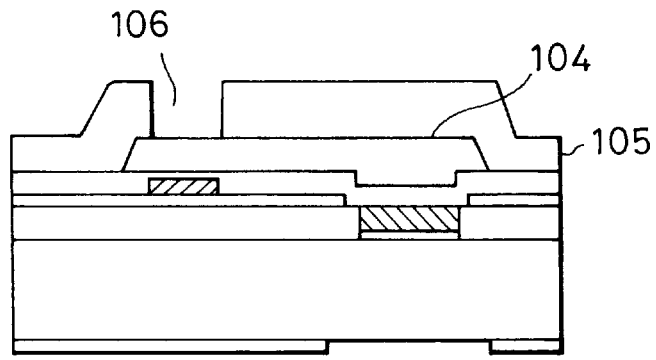

Subsequently, the silicon dioxide layer 101 on the principal surface of the substrate was partially removed by means of etching using an aqueous solution of HF in conjunction with a photolithographic process so that the silicon substrate was exposed. A bubble-jet heating resistor 103 for heating ink thereby boiling it thus generating pressure was formed on the silicon dioxide layer 101. Furthermore, a passivation layer 97 of silicon nitride was formed on the heating resistor 103 (FIG. 18B). As in the case shown in FIG. 2, the size of the opening 110 and that of the dummy layer 111 were determined so that when a through-hole was formed in the silicon substrate by etching the substrate from its back side, the opening size of the through-hole measured at the principal surface of the silicon substrate became smaller than the size of the dummy layer. A flow path formation layer 104 was then formed wherein the flow path formation layer 104 was to be removed by means of etching in a later processing step so as to form a flow path 107. Furthermore, a nozzle formation layer 105 having an emission hole 106 was formed on the flow path formation layer 104 (FIG. 18C).

Figure 18D:
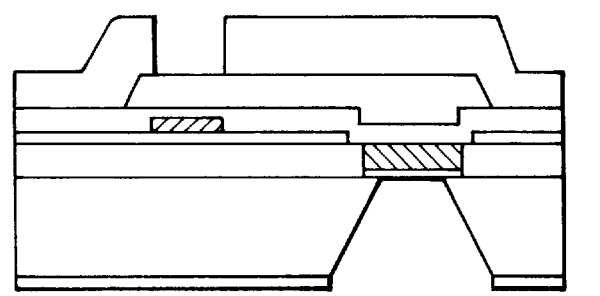
Figure 18E:
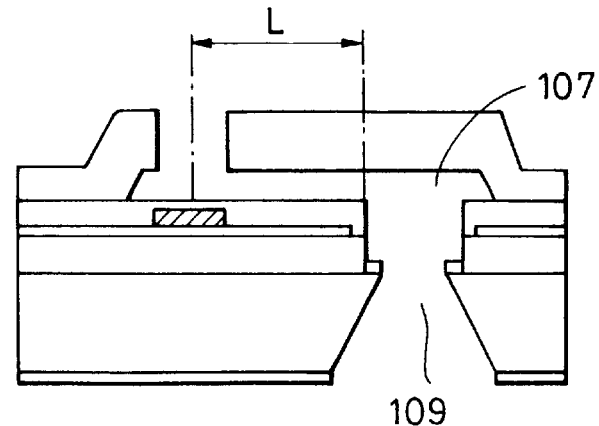

The silicon substrate was then etched via the opening 116 using TMAH so that a hole surrounded by (111) crystal surfaces was formed. In this anisotropical etching process, the etching of the silicon substrate was stopped by the epitaxial growth preventing layer 98 of silicon dioxide (FIG. 18D). That is, since the epitaxial growth preventing layer 98 also serves as an etching stopper layer, it is possible to control the anisotropic etching process for forming a plurality of holes in one wafer or from wafer to wafer independently of the subsequent process of etching the dummy layer. The epitaxial growth preventing layer 98 was etched using buffered hydrofluoric acid, and the dummy layer 111 was removed by means of isotropic etching using TMAH thereby obtaining a membrane formed of a part of the passivation layer of silicon nitride. Subsequently, the part of the passivation film 97 at the location where the dummy layer 111 was present before was removed by means of RIE (reactive ion etching) using $CF_4$ thereby forming a through-hole serving as the ink supplying hole 109. The flow path formation layer 104 was then removed. Thus, a complete ink-jet print head was obtained (FIG. 18E).

When an ink supplying hole is produced using the above-described technique of the invention, it is possible to prevent the variation in the distance L between the end of the ink supplying hole and the center of the heating resistor regardless of the variations in the opening length of the through-hole, the thickness of the silicon substrate, and the orientation flat angle and also regardless of deformation of the opening end from the shape of a straight line during the high-temperature treatment. Thus, it is possible to achieve good uniformity in the ink supplying characteristics of the emission holes. Therefore, it is possible to provide an ink-jet print head having ink supplying holes capable of stably and precisely supplying ink.

Although in this embodiment, silicon dioxide was employed to form the epitaxial growth preventing layer, any proper amorphous or polycrystalline material of metal, semiconductor, or insulator having any electrical characteristics may also be employed as long as it has resistance to a high temperature at which the epitaxial growth is performed and it has the capability of preventing an epitaxial layer from growing on it. When the epitaxial growth preventing layer is also used as the etching stopper layer, it is required that the material of the epitaxial growth preventing layer should also have resistance to the crystal orientation-dependent anisotropic etchant.

Eleventh Embodiment

Herein another example of application of the method of producing a through-hole according to the invention to the production of an ink-jet print head is described below with reference to FIG. 19 illustrating processing steps. A (100) silicon wafer with a thickness of 625 μm was employed as the substrate. First, to prevent the substrate from being cracked during heat treatment performed later, the substrate was thermally oxidized in oxidization gas thereby forming a silicon dioxide layer on the surface of the substrate. An nMOS well and an insulating diffusion layer was formed by performing a heat treatment under conditions similar to those employed to form a p-well in the CMOS process. More specifically, the substrate was subjected to heat treatment in an oxygen ambient at 1200° C. for 8 hours. The silicon dioxide layer on the substrate was removed using buffered hydrofluoric acid so as to obtain an exposed clean surface of the substrate. The silicon substrate was then subjected to high-temperature treatment in an oxidizing gas ambient so as to again form silicon dioxide layers 101 and 102 on the principal surface and the back surface of the substrate, respectively, by means of thermal oxidation. A bubble-jet heating resistor 103 for heating ink thereby boiling it thus generating pressure was formed on the silicon dioxide layer 101 on the surface of the substrate. The silicon dioxide layer 102 on the back surface of the substrate was partially removed by means of etching using an aqueous solution of HF in conjunction with a photolithographic process so as to form an opening 116 in the silicon dioxide layer 103 so that the silicon substrate was exposed via the opening 116 (FIG. 19A). Subsequently, the silicon dioxide layer 101 was partially removed by means of etching using an aqueous solution of HF in conjunction with a photolithographic process so that the silicon substrate was exposed, and a polycrystalline silicon film to be used as a dummy layer was deposited in the exposed area of the silicon substrate. The polycrystalline silicon film was patterned into the dummy layer 111 by means of RIE using $CF_4$ in conjunction with a photolithographic process, and a passivation layer 112 of silicon nitride was formed thereon (FIG. 19B). The size of the opening 116 and the size of the dummy layer 111 were determined, as in the case shown in FIG. 5, so that when a through-hole was formed in the silicon substrate by etching the substrate from its back side, the opening size of the through-hole measured at the principal surface of the silicon substrate became smaller than the size of the dummy layer. A flow path formation layer 104 was then formed wherein the flow path formation layer 104 was to be removed by means of etching in a later processing step so as to form a flow path 107. Furthermore, a nozzle formation layer 105 having an emission hole 106 was formed on the flow path formation layer 104.

Figure 19A:
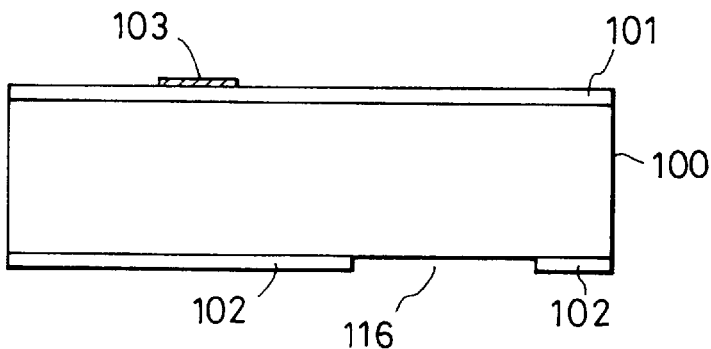
FIG. 19 is a cross-sectional view illustrating the processing steps of producing an ink-jet print head according to an eleventh embodiment of the invention.
Figure 19B:
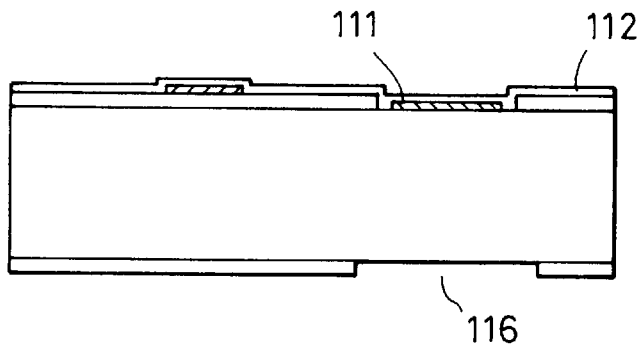
Figure 19C:
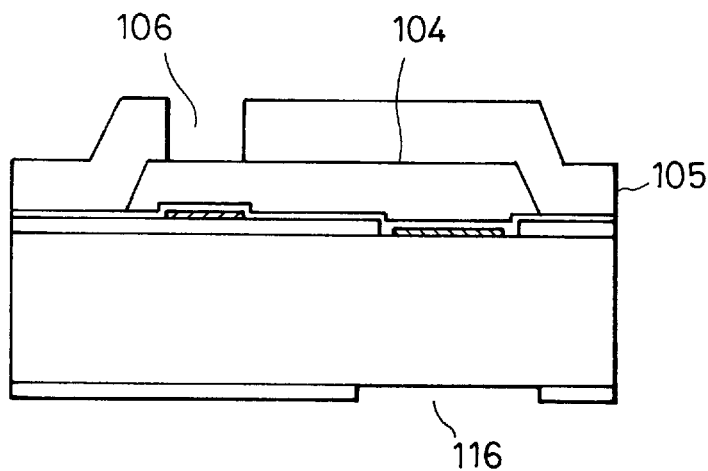
Figure 19D:
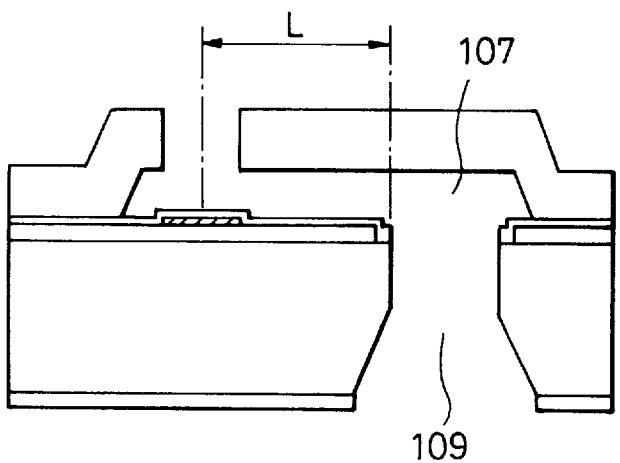

The silicon substrate was then etched via the opening 116 using TMAH so that a hole surrounded by (111) crystal surfaces was formed. The dummy layer 111 was removed by means of isotropic etching using TMAH, and the etching was further continued so that the part of the silicon substrate at the location on which the dummy layer was present before was etched. Subsequently, the part of the passivation film 112 at the location under which the dummy layer was present before was removed by means of RIE using $CF_4$ thereby forming a through-hole serving as the ink supplying hole 109. Finally, the flow path formation layer was removed. Thus, a complete ink-jet print head was obtained (FIG. 19D).

When an ink supplying hole is produced using the above-described technique of the invention, it is possible to prevent the variation in the distance L between the end of the ink supplying hole and the center of the heating resistor regardless of the variations in the opening length of the through-hole, the thickness of the silicon substrate, and the orientation flat angle and also regardless of deformation of the opening end from the shape of a straight line during the high-temperature treatment. Thus, it is possible to achieve good uniformity in the ink supplying characteristics of the emission holes. Therefore, it is possible to provide an ink-jet print head having ink supplying holes capable of stably and precisely supplying ink.

Twelfth Embodiment

A similar technique of forming a through-hole in the production of an ink-jet print head is also disclosed for example in Japanese Patent Laid-Open No. 9-11479. Experiments performed by the inventors of the present invention have revealed that when an ink-jet print head is produced using the technique disclosed in the patent cited above or the techniques employed in the above embodiments, cracks can occur in the material of a nozzle or a membrane during an anisotropic etching process if the etching is performed on a substrate having a resin layer serving as a dummy pattern of an ink flow path formed on a passivation layer. The inventors of the present invention have found that the cracks in the membrane are due to the stress in the membrane. After an intensive investigation, the inventors have finally found that substantially no cracks are produced in the membrane if the membrane of passivation layer is formed so that it has a tensile stress. More specifically, the membrane of passivation layer having a tensile stress can be realized by employing an LP-SiN film (silicon nitride film formed using an LP-CVD apparatus). In this embodiment, the membrane was successfully formed using an LP-SiN film having a tensile stress without producing cracks in the membrane after the anisotropic etching process. However, it has been found that if an LP-SiN film is formed over the entire surface of a wafer to produce an ink-jet print head, another problem can occur as described below. That is, if an LP-SiN film is deposited over the entire surface of a wafer to produce an ink-jet print head, an active element such as an n-MOSFET, a p-MOSFET, or a PN diode for driving a heating resistor is covered with the LP-SiN film. However, the LP-SiN film makes it impossible for the active element to operate in a correct fashion. That is, the LP-SiN film causes an anomaly in the electric characteristics of the active element. To avoid the above problem, the inventors of the invention have proposed herein a technique in which an LP-SiN pattern is formed outside the area in which semiconductor devices are formed. Although in this specific embodiment the LP-SiN film is formed only in the area corresponding to the membrane so as to minimize the influence of the LP-SiN film on the active element, the LP-SiN film may also be formed in other areas as long as no LP-SiN is present in the area where there is an active element.

The method of producing an ink-jet print head according to the present embodiment will be described below.

Figure 22A:
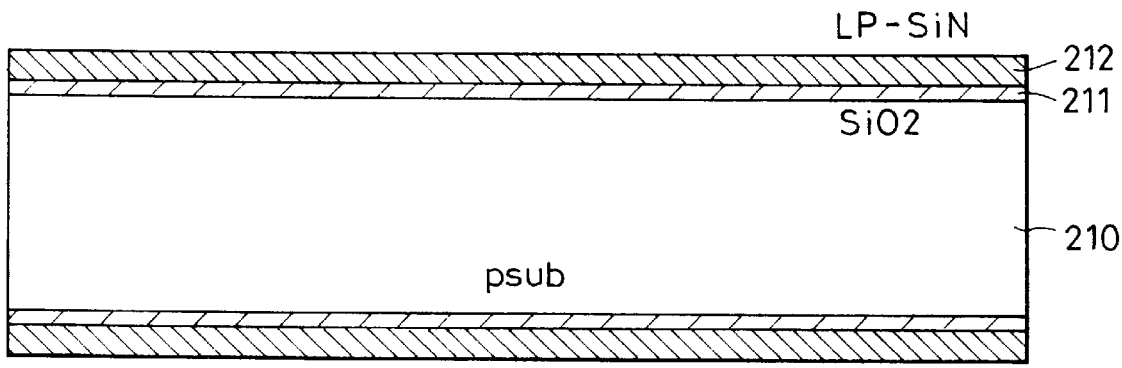
FIG. 22 is a cross-sectional view illustrating the processing steps of producing an ink-jet print head according to a twelfth embodiment of the invention.
Figure 22B:
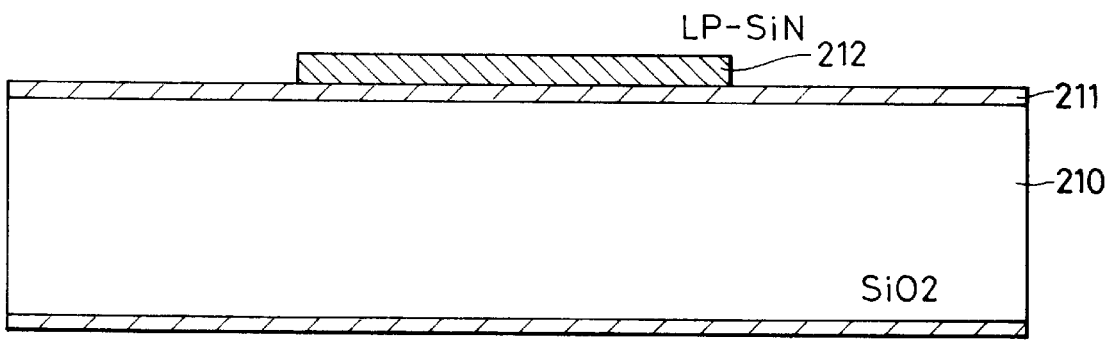
Figure 22C:
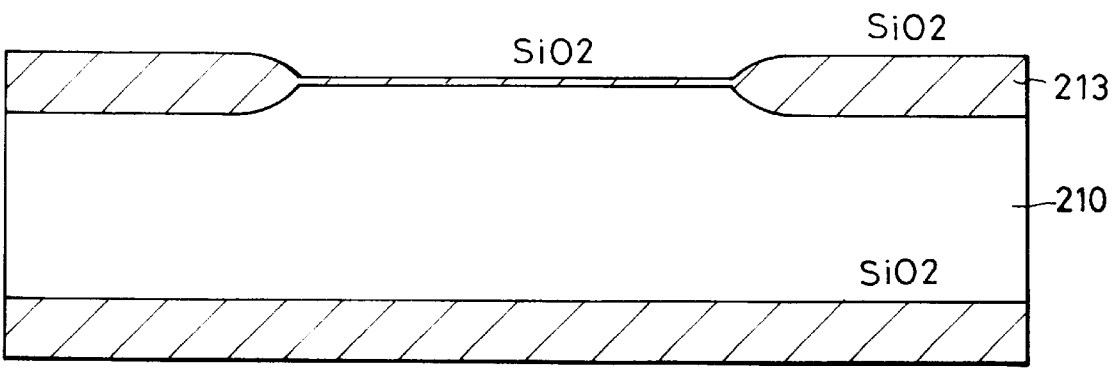
Figure 22D:
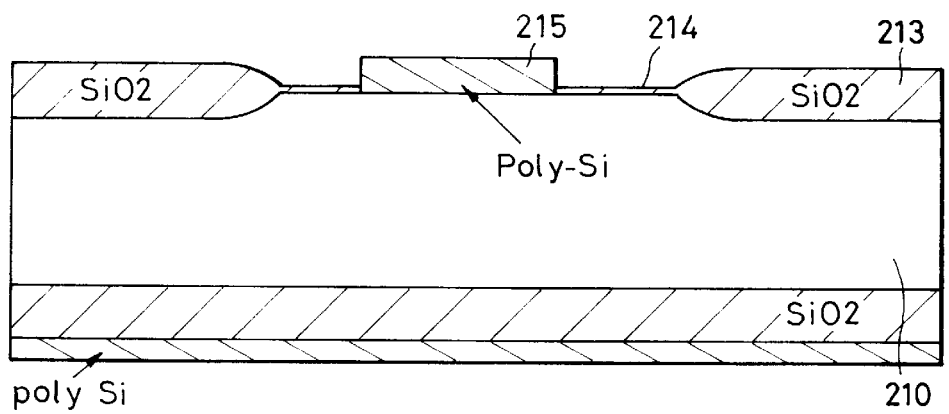
Figure 22E:
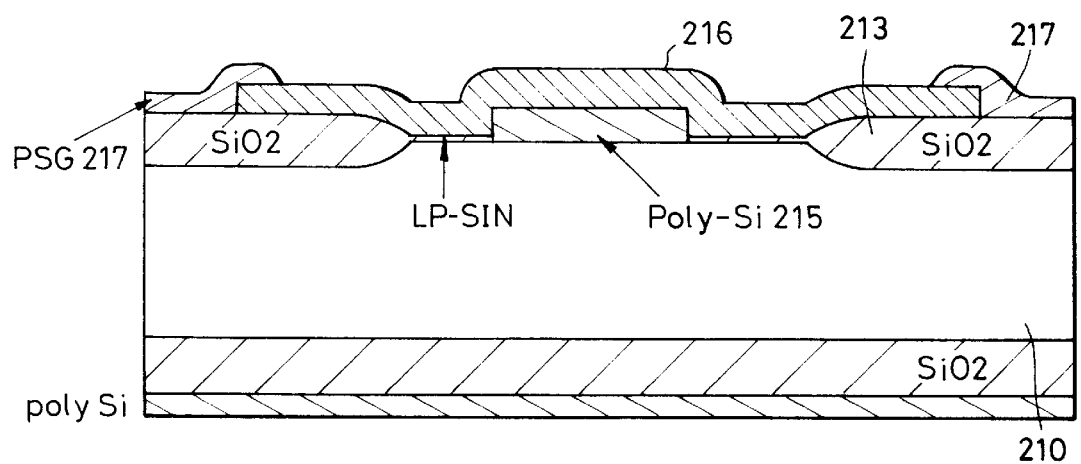
Figure 22G:
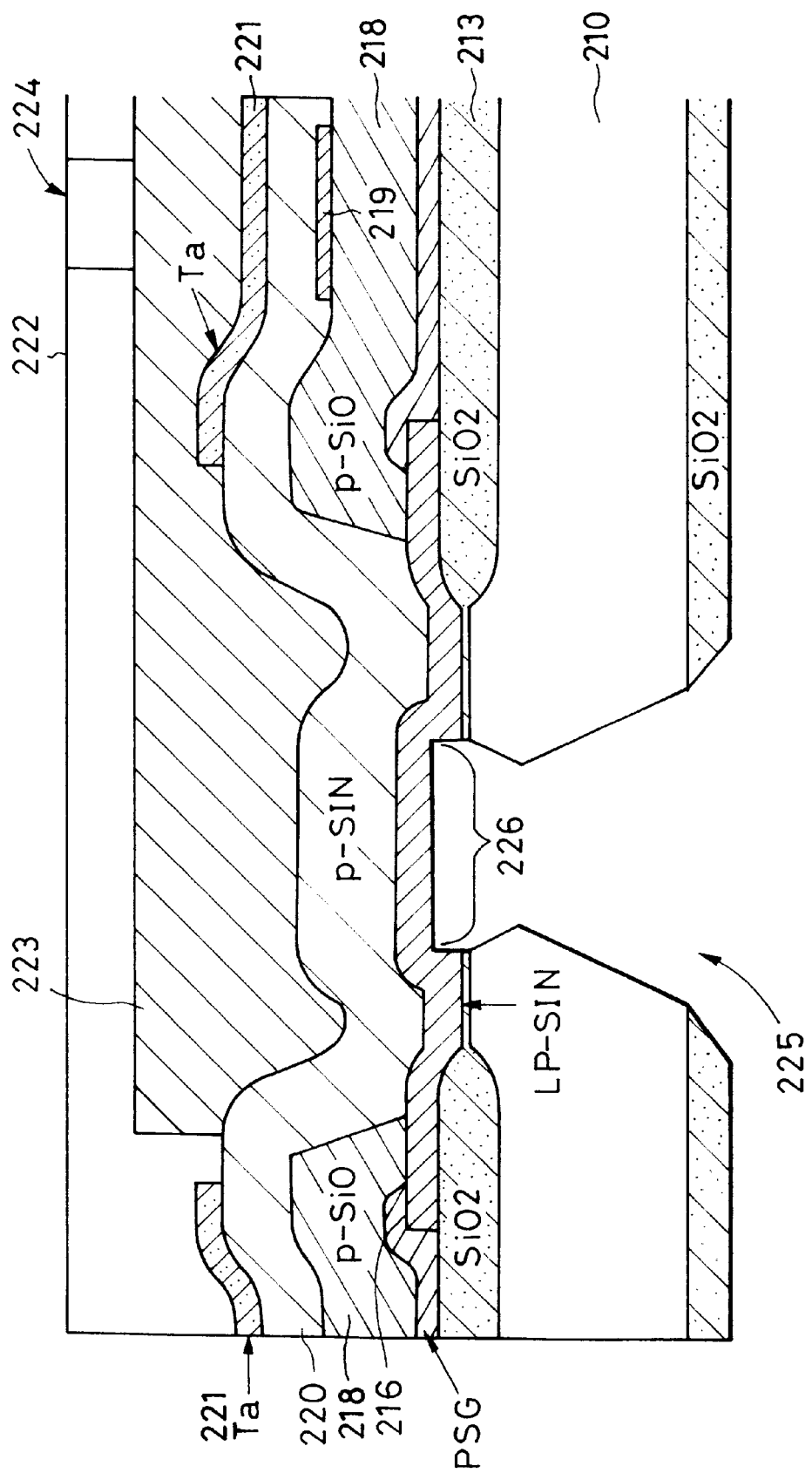

FIGS. 22A to 22G and FIG. 23 are cross-sectional views illustrating the processing steps of producing an ink-jet print head according to the present embodiment. For a better understanding, only an ink supplying hole in a semiconductor device is shown in FIGS. 22A to 22E, while an ink emission pressure generator and a nozzle are also shown in FIGS. 22F to 22G and in FIG. 23.

First, a silicon wafer 210 of a p-type (100) silicon substrate with a thickness of 625 μm was prepared, and thermal oxidation was performed so as to form a silicon oxide film 211 with a thickness of 100 to 500 Å on the silicon substrate. Furthermore, a silicon nitride film 212 was deposited thereon to a thickness of 1000 to 3000 Å by means of low-pressure CVD (FIG. 22A).

The silicon nitride film 212 was then patterned so that it remained only in an area in which a dummy layer was to be formed later. When the above patterning was performed, the silicon nitride film on the back surface of the silicon substrate was entirely removed (FIG. 22B).

The silicon substrate was then subjected to thermal oxidation so as to form a silicon oxide film 213 with a thickness of 6000 to 12000 Å on the surface of the substrate. In this thermal oxidation process, the part covered with the silicon nitride film was not oxidized, while the areas at both sides of the silicon nitride film 13 were selectively oxidized. As a result, those areas at both sides of the silicon nitride film had a thicker silicon oxide film. Subsequently, the silicon nitride film was removed by means of etching (FIG. 22C).

The silicon oxide film 214 which had been present under the silicon nitride film 212 was then patterned by means of etching so that a window was formed in the silicon oxide film 214 at a location where the opening end of a through-hole was to be formed later and so that the surface of the silicon substrate was exposed via the window. A polycrystalline silicon film 215 was formed on the exposed part of the silicon substrate. The width of this polycrystalline silicon film 215 determines the width of the ink supplying hole formed in a later processing step as will be described later (FIG. 22D).

Subsequently, a silicon nitride film (LP-SiN film) 216 with a thickness of 500 to 2000 Å was formed by means of a low-pressure CVD technique. The silicon nitride film (LP-SiN film) 216 was then patterned so that it remained only in the membrane area (dummy layer area). A PSG film 217 was then deposited thereon by means of atmospheric-pressure CVD, and the deposited film was patterned into a desired shape. An Al—Cu film (not shown) was deposited on the PSG film 217, and the deposited film was patterned into a desired shape to serve as an interconnection electrode. At this stage, an active element driven to perform ink emission was obtained (FIG. 22E). (For a better understanding of the structure, the active element is not shown in the figures and only the ink supplying hole is shown FIGS. 22A to 22E).

A plasma silicon oxide (p-SiO) film 218 with a thickness of 1.0 to 1.8 μm was deposited by means of plasma CVD, and the deposited film was patterned into a desired shape.

A TaN film with a thickness of 200 to 1000 Å serving was then deposited on the plasma silicon oxide (p-Sio) film 218 by means of reactive sputtering, and the deposited TaN film was patterned into a desired shape to serve as a heating resistor 219. A plasma silicon nitride (p-SiN) film 220 serving as a protective film for the heating resistor was deposited to a thickness of 6000 to 12000 Å.

A Ta film 221 serving as an anticavitation film was deposited to a thickness of 200 to 1000 Å by means of sputtering, and the deposited Ta film was patterned into a desired shape. Furthermore, patterning was performed to form a lead electrode (FIG. 22F).

A photoresist 223 was coated on the substrate and patterned into a dummy shape of the ink flow path. A cover resin layer 222 used to form a wall of the ink flow path and an emission plate was formed such that the patterned photoresist layer 223 was covered with the cover resin layer 222, and an emission hole 224 was produced in the cover resin layer 222.

After that, the silicon substrate was anisotropically etched from its back side so as to form an ink supplying hole used to supply ink. In the present embodiment, to make the dummy layer 15 and the ink supplying hole 225 have a desired width, the widths of the masks used were set to 145 μm and 500–700 μm, respectively. Note that these widths should be properly determined depending on a specific application and various parameters such as a silicon substrate thickness. The anisotropic etching described above was performed using an aqueous solution of TMAH at a solution temperature of 80 to 90° C. for an etching time of 15 to 20 hours for a silicon substrate with a thickness of about 625 μm (FIG. 22G).

Figure 23:
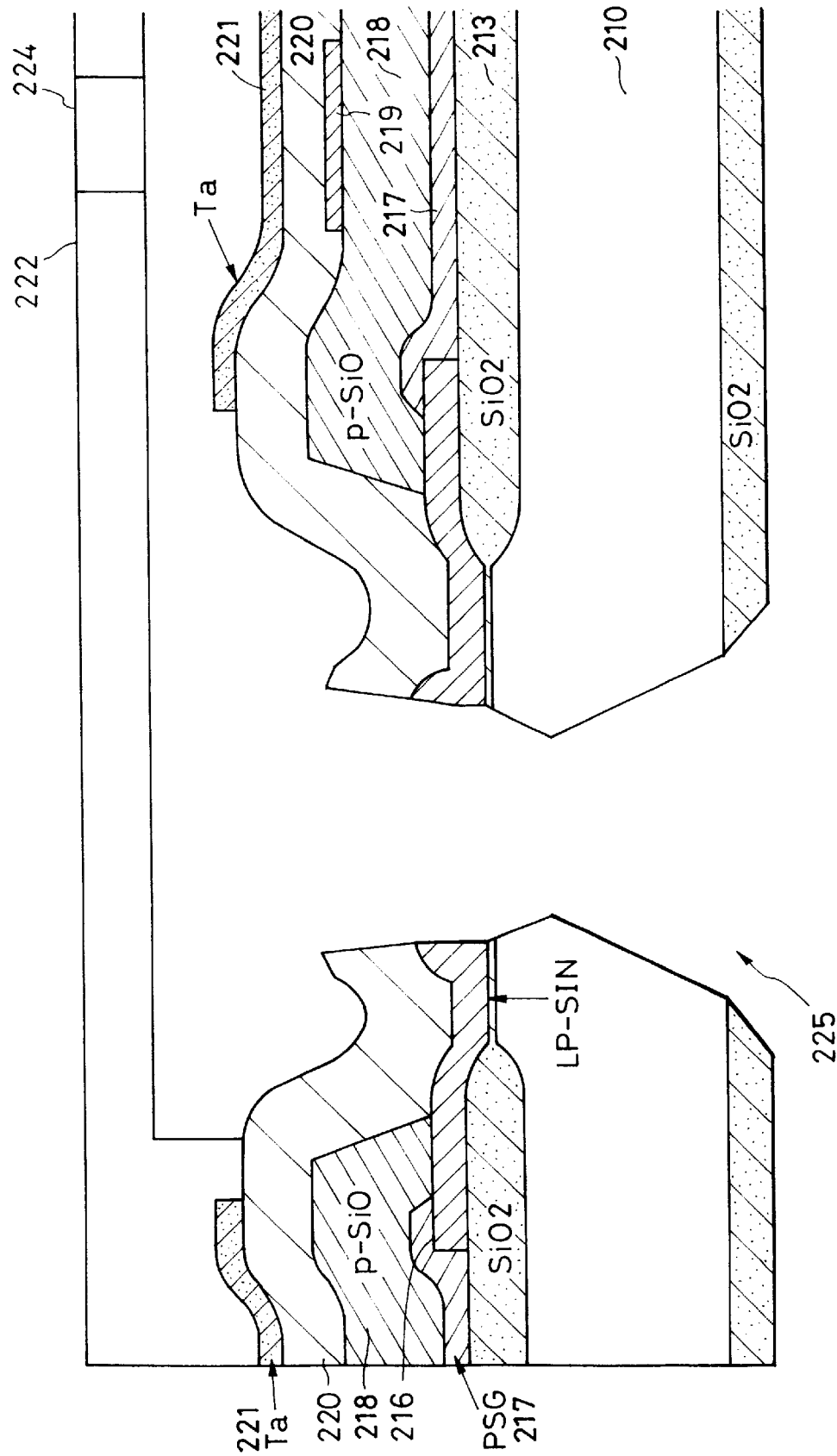
FIG. 23 is a cross-sectional view illustrating the processing steps of producing an ink-jet print head according to the twelfth embodiment of the invention.

After completion of the anisotropic etching of the substrate, the membrane 226 consisting of the silicon nitride (LP-SiN) film 216 and the plasma silicon nitride (p-SiN) film 220 present in the ink supplying hole was removed by means of dry etching using fluorine gas and oxygen-based gas. Furthermore, the photoresist 223 located in the part which was to become the ink flow path was removed. Thus, a complete ink-jet print head according to the present embodiment was obtained (FIG. 23).

In the technique of producing an ink-jet print head according to the present embodiment, no cracks are generated in the membrane during the anisotropic etching process, and thus the resultant ink-jet print head had high printing performance. Furthermore, no anomaly was observed in the characteristics of the active element. This also contributes to realization o f a high-quality ink-jet print head with a high production yield.

Although in the present embodiment the dummy layer was employed, the production technique disclosed herein can also be applied to production using no dummy layer as in the case of the technique disclosed in Japanese Patent Laid-Open No. 9-11479, without encountering problems of cracks in the membrane.

With the method of producing a through-hole according to the present invention, as described above, it is possible to produce a through-hole with a precisely controlled opening length regardless of the variations in the silicon substrate thickness, the orientation flat angle, and the concentration of the crystal orientation-dependent anisotropic etchant and also regardless of the reduction in the linearity of the shape of the opening end of the through-hole. Furthermore, it is possible to produce a through-hole by etching a substrate from its back side, and therefore the through-hole can be formed easily regardless of whatever device is formed on the principal surface of the substrate.

The method of producing a through-hole according to the present invention can also be employed to produce a thin-film cantilever with a precisely controlled length without having a significant variation in the length from wafer to wafer or from lot to lot. This thin-film cantilever has precisely controlled mechanical characteristics and is especially suitable for use in a scanning probe microscope. The substrate for producing a through-hole according to the present invention can also be employed to produce such a thin-film cantilever.

Furthermore, the substrate having a through-hole according to the present invention can be used to realize a nozzle for supplying gas or liquid. If a heating resistor, a flow path, and a nozzle are formed on the surface of the above-described substrate, it is possible to obtain an ink-jet print head having an through-hole serving as an ink supplying hole.

What is claimed is:

1. A method of producing a through-hole in a silicon substrate, said method comprising the step of:
   (a) forming a dummy layer on the principal surface of said substrate at a location where the through-hole will be formed, wherein said dummy layer is made of a polycrystalline silicon film, said dummy layer being capable of being selectively etched without etching the material of said substrate;
   (b) forming a passivation layer having resistance to an etching process on said substrate such that said dummy layer is covered with said passivation layer;
   (c) forming an etching mask layer on the back surface of said substrate, said etching mask layer having an opening corresponding to said dummy layer;
   (d) etching the substrate by means of a crystal orientation-dependent anisotropic etching process until said dummy layer is exposed via said opening;
   (e) removing said dummy layer by etching said dummy layer from the part which has been exposed in said step of etching the substrate; and
   (f) partially removing said passivation layer so as to form a through-hole.

2. A method of producing a through-hole in a silicon substrate, said method comprising the step of:
   (a) forming a dummy layer on the principal surface of said substrate at a location where the through-hole will be formed, said dummy layer being formed on said substrate in an embedded fashion by anodizing said substrate to convert it to a porous material, wherein said dummy layer is capable of being selectively etched without etching the material of said substrate;
   (b) forming a passivation layer having resistance to an etching process on said substrate such that said dummy layer is covered with said passivation layer;
   (c) forming an etching mask layer on the back surface of said substrate, said etching mask layer having an opening corresponding to said dummy layer;
   (d) etching the substrate by means of a crystal orientation-dependent anisotropic etching process until said dummy layer is exposed via said opening;
   (e) removing said dummy layer by etching said dummy layer from the part which has been exposed in said step of etching the substrate; and
   (f) partially removing said passivation layer so as to form a through-hole.

3. A method of producing a through-hole in a silicon substrate, said method comprising the step of:
   (a) forming a dummy layer on the principal surface of said substrate at a location where the through-hole will be formed, said dummy layer comprising silicon dioxide formed by oxidizing porous silicon formed on said substrate in an embedded fashion by anodizing said substrate thereby converting it to porous silicon, wherein the dummy layer is capable of being selectively etched without etching the material of said substrate;
   (b) forming a passivation layer having resistance to an etching process on said substrate such that said dummy layer is covered with said passivation layer;
   (c) forming an etching mask layer on the back surface of said substrate, said etching mask layer having an opening corresponding to said dummy layer;
   (d) etching the substrate by means of a crystal orientation-dependent anisotropic etching process until said dummy layer is exposed via said opening;
   (e) removing said dummy layer by etching said dummy layer from the part which has been exposed in said step of etching the substrate; and
   (f) partially removing said passivation layer so as to form a through-hole.

4. A method of producing a through-hole in a silicon substrate, said method comprising the step of:
   (a) forming a dummy layer on the principal surface of said substrate at a location where the through-hole will be formed, said dummy layer being capable of being selectively etched without etching the material of said substrate;
   (b) forming a passivation layer having resistance to an etching process on said substrate such that said dummy layer is covered with said passivation layer;
   (c) forming an etching mask layer on the back surface of said substrate, said etching mask layer having an opening corresponding to said dummy layer;
   (d) etching the substrate by means of a crystal orientation-dependent anisotropic etching process until said dummy layer is exposed via said opening;
   (e) removing said dummy layer by etching said dummy layer from the part which has been exposed in said step of etching the substrate, wherein a membrane of said passivation layer having a tensile stress is formed; and
   (f) partially removing said passivation layer so as to form a through-hole.

5. A method of producing a through-hole, according to claim 4, wherein said passivation layer is a silicon nitride film formed by means of a low-pressure CVD technique.

6. A method of producing a through-hole, according to claim 5, wherein said passivation layer is patterned such that it remains only near the through-hole.

7. A method of producing an ink-jet print head comprising an emission hole for emitting ink, an ink flow path in communication with said emission hole, and a substrate having an emission energy generator for emitting ink and a through-hole serving as an ink supplying hole for supplying ink into said ink flow path, said method comprising the steps of:
   (a) forming a dummy layer on the principal surface of said substrate at a location where the through-hole will be formed, wherein said dummy layer is made of a polycrystalline silicon film, said dummy layer being capable of being selectively etched without etching the material of said substrate;
   (b) forming a passivation layer having resistance to an etching process on said substrate such that said dummy layer is covered with said passivation layer;
   (c) forming an etching mask layer on the back surface of said substrate, said etching mask layer having an opening corresponding to said dummy layer;
   (d) etching the substrate by means of a crystal orientation-dependent anisotropic etching process until said dummy layer is exposed via said opening;
   (e) removing said dummy layer by etching said dummy layer from the part which has been exposed in said step of etching the substrate; and
   (f) partially removing said passivation layer so as to form a through-hole serving as said ink supplying hole.

8. A method of producing an ink-jet print head comprising an emission hole for emitting ink, an ink flow path in communication with said emission hole, and a substrate having an emission energy generator for emitting ink and a through-hole serving as an ink supplying hole for supplying ink into said ink flow path, said method comprising the steps of:

(a) forming a dummy layer on the principal surface of said substrate at a location where the through-hole will be formed, wherein said dummy layer is formed on said substrate in an embedded fashion by anodizing said substrate thereby converting it to a porous material, said dummy layer being capable of being selectively etched without etching the material of said substrate;

(b) forming a passivation layer having resistance to an etching process on said substrate such that said dummy layer is covered with said passivation layer;

(c) forming an etching mask layer on the back surface of said substrate, said etching mask layer having an opening corresponding to said dummy layer;

(d) etching the substrate by means of a crystal orientation-dependent anisotropic etching process until said dummy layer is exposed via said opening;

(e) removing said dummy layer by etching said dummy layer from the part which has been exposed in said step of etching the substrate; and (f) partially removing said passivation layer so as to form a through-hole serving as said ink supplying hole.

9. A method of producing an ink-jet print head comprising an emission hole for emitting ink, an ink flow path in communication with said emission hole, and a substrate having an emission energy generator for emitting ink and a through-hole serving as an ink supplying hole for supplying ink into said ink flow path, said method comprising the steps of:

(a) forming a dummy layer on the principal surface of said substrate at a location where the through-hole will be formed, wherein said dummy layer is made up of silicon dioxide formed by oxidizing porous silicon formed on said substrate in an embedded fashion by anodizing said substrate thereby converting it to porous silicon, said dummy layer being capable of being selectively etched without etching the material of said substrate;

(b) forming a passivation layer having resistance to an etching process on said substrate such that said dummy layer is covered with said passivation layer;

(c) forming an etching mask layer on the back surface of said substrate, said etching mask layer having an opening corresponding to said dummy layer;

(d) etching the substrate by means of a crystal orientation-dependent anisotropic etching process until said dummy layer is exposed via said opening;

(e) removing said dummy layer by etching said dummy layer from the part which has been exposed in said step of etching the substrate; and (f) partially removing said passivation layer so as to form a through-hole serving as said ink supplying hole.

10. A method of producing an ink-jet print head comprising an emission hole for emitting ink, an ink flow path in communication with said emission hole, and a substrate having an emission energy generator for emitting ink and a through-hole serving as an ink supplying hole for supplying ink into said ink flow path, said method comprising the steps of:

(a) forming a dummy layer on the principal surface of said substrate at a location where the through-hole will be formed, said dummy layer being capable of being selectively etched without etching the material of said substrate;

(b) forming a passivation layer having resistance to an etching process on said substrate such that said dummy layer is covered with said passivation layer;

(c) forming an etching mask layer on the back surface of said substrate, said etching mask layer having an opening corresponding to said dummy layer;

(d) etching the substrate by means of a crystal orientation-dependent anisotropic etching process until said dummy layer is exposed via said opening;

(e) removing said dummy layer by etching said dummy layer from the part which has been exposed in said step of etching the substrate, wherein a membrane of said passivation layer is formed by etching said dummy layer, said membrane of the passivation layer has a tensile stress; and (f) partially removing said passivation layer so as to form a through-hole serving as said ink supplying hole.

11. A method of producing an ink-jet print head, according to claim 10, wherein said passivation layer is a silicon nitride film formed by means of a low-pressure CVD technique.

12. A method of producing an inkjet print head, according to claim 11, wherein said passivation layer is patterned such that it remains only near the through-hole.

13. A method of producing an ink-jet print head comprising an emission hole for emitting ink, an ink flow path in communication with said emission hole, and a substrate having an emission energy generator for emitting ink and a through-hole serving as an ink supplying hole for supplying ink into said ink flow path, said method comprising the steps of:

(a) forming an epitaxial growth preventing layer for preventing epitaxial growth on a part of said substrate, and then forming an epitaxial layer on said substrate thereby forming a dummy layer made of a polycrystalline silicon film, capable of being selectively etched without etching the material of said substrate, said dummy layer being formed on said epitaxial growth preventing layer at a location where the through-hole will be formed;

(b) forming a passivation layer having resistance to an etching process on said substrate such that said dummy layer is covered with said passivation layer;

(c) forming an etching mask layer on the back surface of said substrate, said etching mask layer having an opening corresponding to said dummy layer;

(d) etching the substrate by means of a crystal orientation-dependent anisotropic etching process until said epitaxial growth preventing layer is exposed via said opening;

(e) removing the part of said epitaxial growth preventing layer exposed in the step of etching the substrate;

(f) removing said dummy layer by etching it via the removed part of said epitaxial growth preventing layer; and (g) partially removing said passivation layer so as to form a through-hole.

14. A method of producing an ink-jet print head, according to claim 13, wherein said dummy layer is formed on said substrate in an embedded fashion by anodizing said substrate thereby converting it to a porous material.

15. A method of producing an ink-jet print head comprising an emission hole for emitting ink, an ink flow path in communication with said emission hole, and a substrate having an emission energy generator for emitting ink and a through-hole serving as an ink supplying hole for supplying ink into said ink flow path, said method comprising the steps of:

(a) forming an epitaxial growth preventing layer for preventing epitaxial growth on a part of said substrate, and then forming an epitaxial layer on said substrate thereby forming a dummy layer made up of silicon dioxide formed by oxidizing porous silicon formed on said substrate in an embedded fashion by anodizing said substrate thereby converting it to porous silicon, wherein said dummy layer is capable of being selectively etched without etching the material of said substrate, said dummy layer being formed on said epitaxial growth preventing layer at a location where the through-hole will be formed;

(b) forming a passivation layer having resistance to an etching process on said substrate such that said dummy layer is covered with said passivation layer;

(c) forming an etching mask layer on the back surface of said substrate, said etching mask layer having an opening corresponding to said dummy layer;

(d) etching the substrate by means of a crystal orientation-dependent anisotropic etching process until said epitaxial growth preventing layer is exposed via said opening;

(e) removing the part of said epitaxial growth preventing layer exposed in the step of etching the substrate;

(f) removing said dummy layer by etching it via the removed part of said epitaxial growth preventing layer; and (g) partially removing said passivation layer so as to form a through-hole.

16. A method of producing an ink-jet print head comprising an emission hole for emitting ink, an ink flow path in communication with said emission hole, and a substrate having an emission energy generator for emitting ink and a through-hole serving as an ink supplying hole for supplying ink into said ink flow path, said method comprising the steps of:

(a) forming an epitaxial growth preventing layer for preventing epitaxial growth on a part of said substrate, and then forming an epitaxial layer on said substrate thereby forming a dummy layer capable of being selectively etched without etching the material of said substrate, said dummy layer being formed on said epitaxial growth preventing layer at a location where the through-hole will be formed;

(b) forming a passivation layer having resistance to an etching process on said substrate such that said dummy layer is covered with said passivation layer, (c) forming an etching mask layer on the back surface of said substrate, said etching mask layer having an opening corresponding to said dummy layer;

(d) etching the substrate by means of a crystal orientation-dependent anisotropic etching process until said epitaxial growth preventing layer is exposed via said opening;

(e) removing the part of said epitaxial growth preventing layer exposed in the step of etching the substrate;

(f) removing said dummy layer by etching it via the removed part of said epitaxial growth preventing layer, wherein a membrane of said passivation layer having a tensile stress is formed by etching said dummy layer; and (g) partially removing said passivation layer so as to form a through-hole.

17. A method of producing an ink-jet print head, according to claim 16, wherein said passivation layer is a silicon nitride film formed by means of a low-pressure CVD technique.

* * * * *

UNITED STATES PATENT AND TRADEMARK OFFICE
CERTIFICATE OF CORRECTION

PATENT NO. : 6,143,190
DATED : November 7, 2000
INVENTOR(S) : Takayuki Yagi et al.

It is certified that error appears in the above-identified patent and that said Letters Patent is hereby corrected as shown below:

Title page,
Item [75] Inventors "Kawasuki," should read -- Kawasaki, --.

Column 1,
Line 30, "to produce" should read -- in producing --;
Lines 34 and 35, "for" should read -- of --;
Line 48, "microscope s" should read -- microscopes --.

Figure 20A:
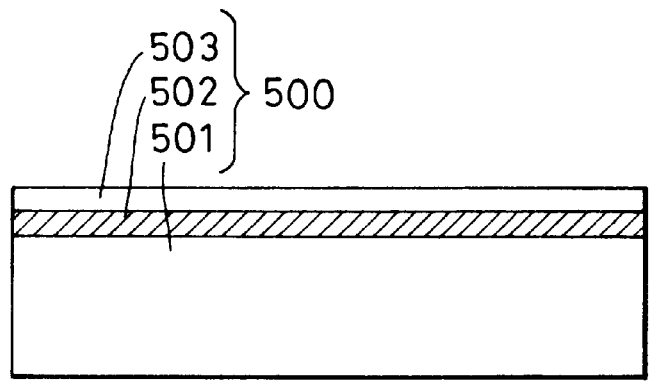
FIG. 20 is a cross-sectional view illustrating the main processing steps of producing a piezoresistance cantilever according to a conventional technique.
Figure 20B:
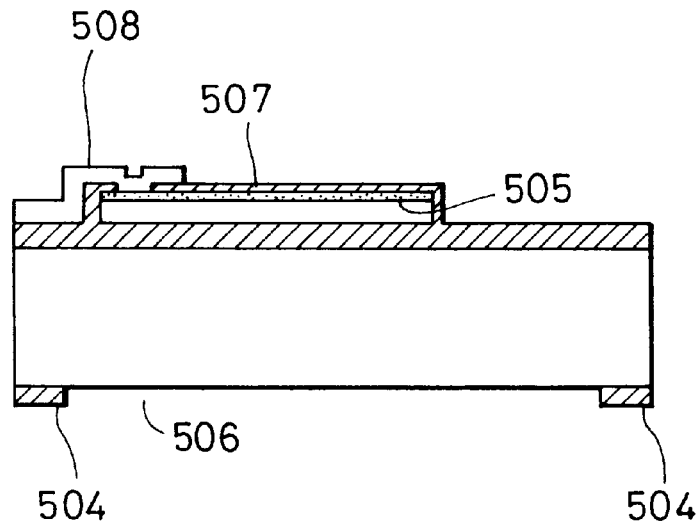
Figure 20C:
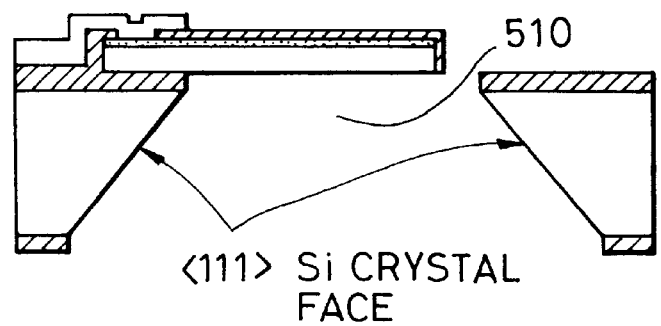
Figure 21:
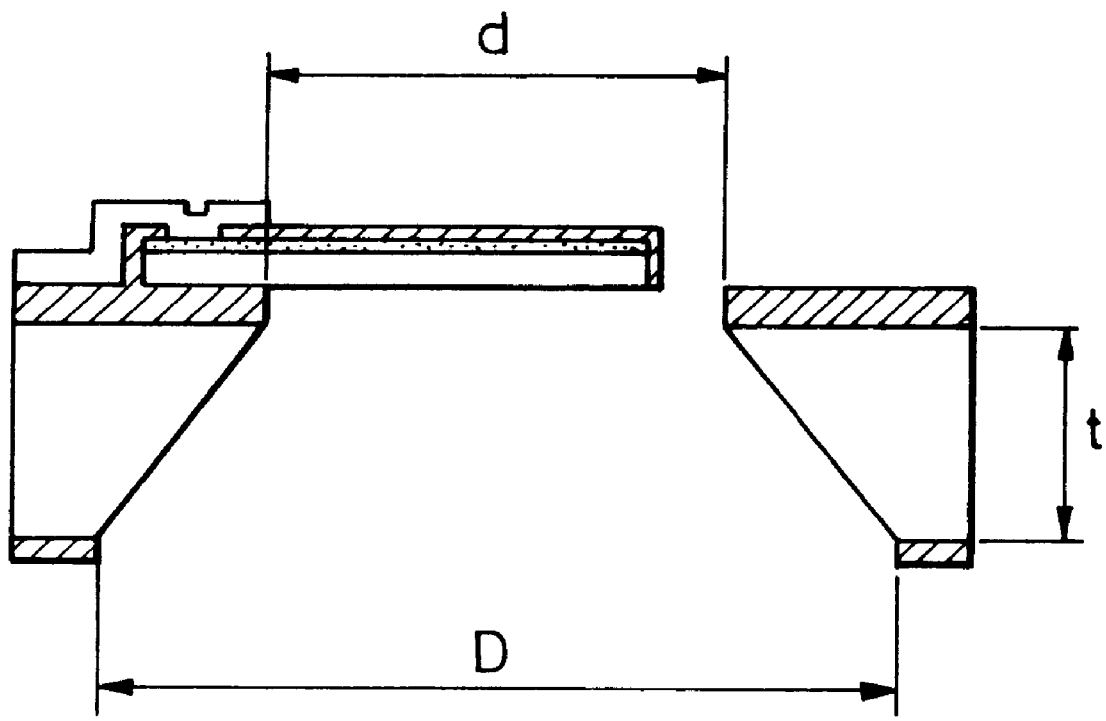
FIG. 21 is a cross-sectional view illustrating the problems in producing a through-hole according to the conventional technique.

Column 2,
Line 7, "FIG. 20." should read -- FIGS. 20A through 20C. --;
Line 12, "also" should read -- also on --;
Line 44, "obtain" should read -- obtain a --;
Line 62, "wafer-to-wafer and lot-to-lot" should read -- wafer to wafer and lot to lot --.

Column 3,
Line 18, "of" (first occurrence) should read -- on the --;
Line 22, "wafer-to-wafer" should read -- wafer to wafer --;
Line 27, "ammoniumhydoroxide)" should read -- ammonium hydroxide) --;
Line 33, ""TMAHW" should read -- "TMAH --.

Column 4,
Line 34, "of" should read -- with --.

Column 5,
Line 56, "FIG. 1 is a" should read -- FIGS. 1A-1F are -- and "view" should read -- views --;
Line 62, "FIG. 3 is a" should read -- FIGS. 3A and 3B are -- and "view" should read -- views --;
Line 5, "FIG. 4 is a" should read -- FIGS. 4A-4F are -- and "view" should read -- views --.

UNITED STATES PATENT AND TRADEMARK OFFICE
CERTIFICATE OF CORRECTION

PATENT NO. : 6,143,190
DATED : November 7, 2000
INVENTOR(S) : Takayuki Yagi et al.

It is certified that error appears in the above-identified patent and that said Letters Patent is hereby corrected as shown below:

Column 6,
Line 4, "FIG. 6 is a" should read -- FIGS. 6A-6C are -- and "view" should read -- views --;
Line 12, "FIG. 9 is a" should read -- FIGS. 9A-9F are -- and "view" should read -- views --;
Line 17, "FIG. 11 is a" should read -- FIGS. 11A-11G are -- and "view" should read -- views --;
Line 25, "FIG. 13 is a" should read -- FIGS. 13A-13D are -- and "view" should read -- views --;
Line 28, "FIG. 14 is a" should read -- FIGS. 14E-14G are -- and "view" should read -- views --;
Line 31, "FIG. 15 is a" should read -- FIGS. 15A-15C are -- and "view" should read -- views --;
Line 34, "FIG. 16 is a" should read -- FIGS. 16D-16F are -- and "view" should read -- views --;
Line 40, "FIG. 18 is a" should read -- FIG. 18A-18E are -- and "view" should read -- views --;
Line 43, "FIG. 19 is a" shuld read -- FIGS. 19A-19D are -- and "view" should read -- views --;
Line 47, "FIG. 20 is a" should read -- FIGS. 20A-20C are-- and "view" should read -- views --;
Line 53, "FIG. 22 is a" should read -- FIGS. 22A-22G are -- and "view" should read -- views --.

Column 8,
Line 21, "(K," should read -- (K. --;
Line 46, "(H," should read -- (H. --;
Line 48, "Vol. 60" should read -- Vol. 60, --.

Column 9,
Line 14, "servers" should read -- serves --;
Line 58, "(D-" should read -- (D'- --.

UNITED STATES PATENT AND TRADEMARK OFFICE
CERTIFICATE OF CORRECTION

PATENT NO. : 6,143,190
DATED : November 7, 2000
INVENTOR(S) : Takayuki Yagi et al.

Page 3 of 4

It is certified that error appears in the above-identified patent and that said Letters Patent is hereby corrected as shown below:

Column 10,
Line 32, "FIG 1 is a cross-section view" should read -- FIGS. 1A-1F are cross-sectional views --;
Line 43, "20" should read -- 2C --;
Line 52, "FIG. 1." should read -- FIGS. 1A-1F. --.

Column 11,
Line 8, "$\mu$m" should read -- nm --.

Column 12,
Line 8, "FIG. 4 is a" should read -- FIGS. 4A-4F are -- and "view" should read -- views --;
Line 18, "20" should read -- 20C --.

Column 13,
Line 37, "$\delta$" should read -- $\delta$ are --;
Line 38, "opening have" should read -- opening and have the --;
Line 39, "by d2." should read -- with d2. --.

Column 14,
Line 60, "FIG. 9." should read -- FIGS. 9A-9F. --.

Column 16,
Line 3, "Fig. 11." should read -- FIGS. 11A-11G. --;
Line 6, "<100>" should read -- (100) --;
Line 53, "to" should read -- and -- ;
Line 67, "FIGS. 13 and 14" should read -- FIGS. 13A-13D and FIGS. 14E-14G --.

Column 17,
"FIGS. 15 and 16" should read -- FIGS. 15A-15C and 16D-16F --.

Column 18,
Line 4, "15a)." should read -- 15A). --;
Line 9, "15b)." should read -- 15B). --.

UNITED STATES PATENT AND TRADEMARK OFFICE
CERTIFICATE OF CORRECTION

PATENT NO. : 6,143,190
DATED : November 7, 2000
INVENTOR(S) : Takayuki Yagi et al.

It is certified that error appears in the above-identified patent and that said Letters Patent is hereby corrected as shown below:

Column 19,
Line 32, "FIG. 18," should read -- FIGS. 18A-18E, --;
Line 45, "was" should read -- were --.

Column 21,
Line 13, "FIG. 19" should read -- FIGS. 19A-19D --;
Line 20, "was" should read -- were --.

Column 22,
Line 3, "before" should read -- before it --.

Column 23,
Line 55, "serving" should be deleted.

Column 24,
Line 14, "a" should be deleted;
Line 35, " o f" should read -- of --.

Column 25,
Line 4, "an" should read -- a --;
Lines 8, 31 and 54, "step" should read -- steps --.

Column 26,
Line 13, "step" should read -- steps --.

Signed and Sealed this

Fourth Day of December, 2001

*Attest:*

*Attesting Officer*

NICHOLAS P. GODICI
*Acting Director of the United States Patent and Trademark Office*